(12) United States Patent
Pegna et al.

(10) Patent No.: US 12,241,160 B2
(45) Date of Patent: Mar. 4, 2025

(54) FIBER STRUCTURES WITH EMBEDDED SENSORS

(71) Applicant: FREE FORM FIBERS, LLC, Saratoga Springs, NY (US)

(72) Inventors: Joseph Pegna, Saratoga Springs, NY (US); Thomas Philip Budka, Niskayuna, NY (US)

(73) Assignee: Free Form Fibers, LLC, Saratoga Springs, NY (US)

( * ) Notice: Subject to any disclaimer, the term of this patent is extended or adjusted under 35 U.S.C. 154(b) by 432 days.

(21) Appl. No.: 17/658,665

(22) Filed: Apr. 11, 2022

(65) Prior Publication Data
US 2022/0404212 A1 Dec. 22, 2022

Related U.S. Application Data

(60) Provisional application No. 63/212,799, filed on Jun. 21, 2021.

(51) Int. Cl.
*C23C 16/48* (2006.01)
*B33Y 10/00* (2015.01)
(Continued)

(52) U.S. Cl.
CPC .............. *C23C 16/48* (2013.01); *B33Y 10/00* (2014.12); *B33Y 80/00* (2014.12); *G01K 17/00* (2013.01)

(58) Field of Classification Search
CPC ........ H01Q 1/273; H01Q 1/241; B33Y 10/00; B33Y 80/00; D02G 3/441; D02G 3/36; D02G 3/12; D02G 3/40
See application file for complete search history.

(56) References Cited

U.S. PATENT DOCUMENTS 3,062,683 A 11/1962 Kalleberg et al.
3,103,476 A 9/1963 Mumm
(Continued)

FOREIGN PATENT DOCUMENTS

CN 103387230 A 11/2013
EP 1 209 123 A2 5/2002
(Continued)

OTHER PUBLICATIONS

Ares, et al. "Columnar-to-Equiaxed Transition in Metal-Matrix Composites Reinforced with Silicon Carbide Particles", Hindawi Publishing Corporation, Journal of Metallurgy, vol. 2013, Article ID 628495, 12 pages.
(Continued)

*Primary Examiner* — Michael P Wieczorek
(74) *Attorney, Agent, or Firm* — Kevin P. Radigan, Esq.; Heslin Rothenberg Farley & Mesiti P.C.

(57) ABSTRACT

Methods of fabricating fiber structures with embedded sensors are provided. The method includes obtaining a scaffold fiber and forming, by 1½-D printing using laser induced chemical vapor deposition, circuitry on the scaffold fiber to provide a fiber structure with embedded sensor. The forming includes printing a solid state oscillator about the scaffold fiber, and printing a sensing device about the scaffold fiber electrically coupled to the solid state oscillator to effect, at least in part, oscillations of the solid state oscillator. The forming further includes printing an antenna about the scaffold fiber electrically connected to the solid state oscillator to facilitate in operation wireless transmitting of a signal from the fiber structure with embedded sensor.

7 Claims, 18 Drawing Sheets

(51) Int. Cl.
  *B33Y 80/00* (2015.01)
  *G01K 17/00* (2006.01)

(56) References Cited

U.S. PATENT DOCUMENTS

| | | | |
|---|---|---|---|
| 3,148,102 A | 9/1964 | Eakins et al. | |
| 3,285,825 A | 11/1966 | Jens | |
| 3,308,031 A | 3/1967 | Pon | |
| 3,755,061 A | 8/1973 | Schurb | |
| 3,855,061 A | 12/1974 | Triggiani et al. | |
| 3,958,406 A | 5/1976 | Corbiere | |
| 4,076,380 A | 2/1978 | DiMarcello | |
| 4,539,248 A | 9/1985 | Brockington et al. | |
| 4,588,699 A | 5/1986 | Brennan et al. | |
| 4,751,044 A | 6/1988 | Hwang et al. | |
| 4,962,070 A | 10/1990 | Sullivan | |
| 5,094,804 A | 3/1992 | Schweitzer | |
| 5,096,739 A | 3/1992 | Strutt et al. | |
| 5,126,200 A | 6/1992 | Nordine | |
| 5,134,020 A | 7/1992 | Cotteret et al. | |
| 5,147,598 A | 9/1992 | Kapil | |
| 5,296,288 A | 3/1994 | Kourtides et al. | |
| 5,326,731 A | 7/1994 | Bhola et al. | |
| 5,342,022 A | 8/1994 | Artjushenko et al. | |
| 5,349,618 A | 9/1994 | Greenspan | |
| 5,399,430 A | 3/1995 | Nordine et al. | |
| 5,705,122 A | 1/1998 | Curran | |
| 5,786,023 A | 7/1998 | Maxwell et al. | |
| 5,867,552 A | 2/1999 | Marlowe et al. | |
| 5,955,391 A | 9/1999 | Kameda et al. | |
| 6,183,714 B1 | 2/2001 | Smalley et al. | |
| 6,271,802 B1 | 8/2001 | Clark et al. | |
| 6,291,058 B1 | 9/2001 | Goujard et al. | |
| 6,322,889 B1 | 11/2001 | Lara-Curzio et al. | |
| 6,323,413 B1 | 11/2001 | Roth et al. | |
| 6,359,374 B1 | 3/2002 | Dausch et al. | |
| 6,706,400 B2 | 3/2004 | Mercuri et al. | |
| 7,657,142 B2 | 2/2010 | Gasca et al. | |
| 7,666,475 B2 | 2/2010 | Morrison | |
| 8,503,949 B2 * | 8/2013 | Peczalski | H01Q 1/273 455/562.1 |
| 9,206,508 B1 | 12/2015 | Hariharan et al. | |
| 9,217,210 B2 | 12/2015 | Velev et al. | |
| 9,658,087 B1 | 5/2017 | Baur et al. | |
| 9,896,385 B2 | 2/2018 | Harrison et al. | |
| 9,938,393 B2 | 4/2018 | Schneiter et al. | |
| 10,047,015 B2 | 8/2018 | Pegna et al. | |
| 10,546,661 B2 | 1/2020 | Pegna et al. | |
| 10,676,391 B2 | 6/2020 | Harrison et al. | |
| 10,876,227 B2 | 12/2020 | Harrison et al. | |
| 10,882,749 B2 | 1/2021 | Pegna et al. | |
| 10,954,611 B2 * | 3/2021 | Rathnayake | D02G 3/441 |
| 2002/0085968 A1 | 7/2002 | Smalley | |
| 2003/0168146 A1 | 9/2003 | Wenstrup et al. | |
| 2005/0048859 A1 | 3/2005 | Canahan et al. | |
| 2005/0082676 A1 | 4/2005 | Andry et al. | |
| 2005/0181192 A1 | 8/2005 | Steffier | |
| 2005/0247904 A1 | 11/2005 | Raj et al. | |
| 2005/0255033 A1 | 11/2005 | Shimoji et al. | |
| 2006/0039524 A1 | 2/2006 | Feinroth et al. | |
| 2006/0115648 A1 | 6/2006 | Chen | |
| 2007/0063226 A1 | 3/2007 | Tanaka et al. | |
| 2007/0093587 A1 | 4/2007 | Shen et al. | |
| 2008/0143209 A1 | 6/2008 | Tan et al. | |
| 2008/0153959 A1 | 6/2008 | Charati et al. | |
| 2008/0175988 A1 | 7/2008 | Chiu et al. | |
| 2009/0064476 A1 | 3/2009 | Cross et al. | |
| 2009/0220040 A1 | 9/2009 | Takagi | |
| 2010/0040834 A1 | 2/2010 | Dawes et al. | |
| 2010/0055352 A1 | 3/2010 | Maxwell | |
| 2010/0261058 A1 | 10/2010 | Lopatin et al. | |
| 2010/0320171 A1 | 12/2010 | Mao et al. | |
| 2011/0124483 A1 | 5/2011 | Shah et al. | |
| 2011/0170653 A1 | 7/2011 | Cabrero et al. | |
| 2011/0274906 A1 | 11/2011 | Kim et al. | |
| 2011/0286570 A1 | 11/2011 | Farmer et al. | |
| 2012/0002777 A1 | 1/2012 | Lahoda et al. | |
| 2012/0076718 A1 | 3/2012 | Liu et al. | |
| 2012/0135224 A1 | 5/2012 | Guzman de Villoria et al. | |
| 2012/0207264 A1 | 8/2012 | Van Den Berghe et al. | |
| 2012/0287553 A1 | 11/2012 | Ramani et al. | |
| 2012/0315467 A1 | 12/2012 | Lafdi et al. | |
| 2012/0315815 A1 | 12/2012 | Fong et al. | |
| 2013/0010915 A1 | 1/2013 | Garnier et al. | |
| 2013/0077731 A1 | 3/2013 | Sherwood et al. | |
| 2013/0093122 A1 | 4/2013 | Schultz et al. | |
| 2013/0106245 A1 | 5/2013 | Giebe et al. | |
| 2013/0163711 A1 | 6/2013 | Zabiego et al. | |
| 2013/0329849 A1 | 12/2013 | Mazaudier | |
| 2014/0170919 A1 | 6/2014 | Manipatruni et al. | |
| 2017/0326838 A1 | 11/2017 | Pegna et al. | |
| 2017/0331022 A1 | 11/2017 | Pegna et al. | |
| 2017/0369998 A1 | 12/2017 | Pegna et al. | |
| 2018/0087157 A1 | 3/2018 | Harrison et al. | |
| 2018/0087214 A1 | 3/2018 | Harrison et al. | |
| 2018/0370860 A1 | 12/2018 | Pegna et al. | |
| 2019/0047047 A1 | 2/2019 | Mark | |
| 2020/0203028 A1 | 6/2020 | Pegna et al. | |
| 2021/0087726 A1 | 3/2021 | Pegna et al. | |
| 2021/0222332 A1 | 7/2021 | Harrison et al. | |
| 2021/0230743 A1 | 7/2021 | Harrison et al. | |
| 2021/0253434 A1 | 8/2021 | Pegna et al. | |
| 2022/0064798 A1 | 3/2022 | Schneiter et al. | |

FOREIGN PATENT DOCUMENTS

| | | |
|---|---|---|
| GB | 2054542 B | 1/1983 |
| GB | 2553390 A | 3/2018 |
| JP | S 61-132628 A | 6/1986 |
| JP | H 01-252780 A | 10/1989 |
| JP | H 03-285877 A | 12/1991 |
| JP | H 07-252662 A | 3/1995 |
| JP | H 09-268065 A | 10/1997 |
| JP | H 10-059780 A | 3/1998 |
| JP | 2002-211980 A | 7/2002 |
| JP | 2005-231952 A | 9/2005 |
| JP | 2013-210372 A | 10/2013 |
| JP | 2015-021754 A | 2/2015 |
| WO | WO 1988/001204 A1 | 2/1988 |
| WO | WO 2010/090624 A1 | 8/2010 |
| WO | WO 2012/109841 A1 | 8/2012 |
| WO | WO 2013/180764 A1 | 12/2013 |
| WO | WO 2014/143937 A1 | 9/2014 |
| WO | WO 2015/200257 A1 | 12/2015 |

OTHER PUBLICATIONS

Behlau, et al., "Mechanical Properties of Carbon and BN Coated SiC Fibers", Ceramic Engineering and Science Proceedings, vol. 24, No. 4, (Jan. 2003), pp. 225-230.

Chen, et al., "Carbide Derived Carbon (CDC) Coatings for Tyranno ZMI SiC Fibers", Ceramic Engineering and Science Proceedings, vol. 24, No. 3, (Jan. 2003), pp. 57-62.

Chen, et al., "Carbothermal Synthesis of Al-O-N Coatings Increasing Strength of SiC Fibers", International Journal of Applied Ceramic Technology, vol. 1, No. 1, Jan. 1, 2004 (pp. 68-75).

Duty et al., "Z-Pinning Approach for 3D Printing Mechanically Isotropic Materials", Additive Manufacturing, vol. 27, pp. 175-184 (May 2019) (Year: 2019).

Gan, Yong X., "Structural Assessment of Nanocomposites", Micron, vol. 43, Issue 7, (2012) pp. 782-817.

Glazoff, et al., "Morphological Analysis of Zirconium Nuclear Fuel Rods Braided with SiC: Quality Assurance and Defect Identification", Journal of Nuclear Materials, vol. 451, Issues 1-3, (Apr. 2014), pp. 216-224.

Hampden-Smith et al., "Chemical Vapor Deposition Metals: Part 1. An Overview of CVD Processes", 1995, Chem. Vap. Deposition, pp. 8-23 (Year: 1995).

Hu, et al., "Oxidation Behavior of Zirconium Diboride-Silicon Carbide at 1800° C.", Scripta Materialia, vol. 57, No. 9, (Nov. 2007), pp. 825-828.

(56) References Cited

OTHER PUBLICATIONS

Jiang et al., "Fabrication of Barium-Strontium Aluminosilicate Coatings on C/SiC Composites via Laser Cladding", Journal of Materials Science & Technology, vol. 33, No. 2, (2017), pp. 166-171.
Johansson et al., "Microfabrication of Three-Dimensional Boron Structures by Laser Chemical Processing", Journal of Applied Physics, vol. 72, No. 12, (1992), (8 pages).
Jouanny, et al., "Study of TiC Coatings on Nicalon Fibre Prepared by Pressure-Pulsed Reactive Chemical Vapour Deposition at Low Pressure", ECS Translations, vol. 25, No. 8, (Jan. 2009), pp. 1267-1272.
Kerans, et al., "High Temperature Composites", Air Force Research Laboratory Report No. AFRL-ML-WP-TP-2002-407, (Aug. 2002), (22 pages).
Kerans, et al., "Interface Design for Oxidation-Resistant Ceramic Composites", Journal of the American Ceramic Society, vol. 85, No. 11, (Nov. 2002), pp. 2599-2632.
Lee, et al., "Microstructure and Mechanical Properties of Al2O3/Y3Al5O12/ZrO2 Ternary Eutectic Materials", Journal of European Ceramic Society, vol. 25, No. 8, (Jan. 2005), pp. 1411-1417.
Liao, et al., "Large-Scale Aligned Silicon Carbonitride Nanotube Arrays: Synthesis, Characterization, and Field Emission Property", Journal of Applied Physics, vol. 101, No. 11, (Jun. 2007), pp. 114306.1-114306.4.
Liu, et al., "Monolithic Integration of Sampled Grating CBR with Electroabsorption Modulator by Combining Selective-Area-Growth MOCVD and Quantum-Well Intermixing", Chinese Physics Letters, vol. 25, No. 10, (Oct. 2008), pp. 3670-3672.
Longtin, et al., "Selective Area Synthesis of Aligned Carbon Nanofibers by Laser-Assisted Catalytic Chemical Vapor Deposition", Diamond & Related Materials, vol. 16 (2007) pp. 1541-1549.
Longtin, et al., "Synthesis of Carbon Nanofiber Films and Nanofiber Composite Coatings by Laser-Assisted Catalytic Chemical Vapor Deposition", Thin Solid Films, vol. 515, No. 5, (2007) pp. 2958-2964.
Luo, et al., "Microstructure, Tensile Strength and Thermostability of W-core SiC Fibers With or Without Carbon Coating", Materials Science & Engineering: A, vol. 647, (2015), pp. 265-276.
Marsh, John, "Quantum Well Intermixing Revolutionizes High Power Laser Diodes", Diodenlaser, Laser Technik Journal, vol. 4, No. 5, DOI: 10.1002/latj.200790190 (Nov. 2007) (4 pages).
Maxwell, et al., "Real-Time Volumetric Growth Rate Measurements and Feedback Control of Three-Dimensional Laser Chemical Vapor Deposition", Appl. Phys. A, vol. 67, No. 3, (1998), pp. 323-329.
Maxwell, et al., "Preparation of Superhard BxCy Fibers by Microvortex-Flow Hyperbaric Laser Chemical Vapor Deposition", Diamond & Related Materials, vol. 16, Issue 8, (Jan. 2007), pp. 1557-1564.
Maxwell et al., "High Temperature Nanocomposites for Nuclear Thermal Propulsion and In-Space Fabrication by Hyperbaric Pressure Laser Chemical Vapor Deposition", Journal of the British Interplanetary Society (JBIS), vol. 66, pp. 328-333 (Year: 2013).
Rosso, M., "Ceramic and Metal Metrix Composites: Routes and Properties", Journal of Materials Processing Technology, vol. 175 (2006), pp. 364-375 (Year: 2006).
Roy, et al., "Atomic Layer Deposition of Alumina Onto Carbon Fibers", Journal of the American Ceramic Society, vol. 94, No. 7, (Jul. 2011), pp. 2014-2022.
Shi et al., "Synthesis of Carbon Nanotubes by Laswer-Assisted Chemical Vapor Deposition", SPIE, p. 61070M-1-61070M-8 (Year: 2006).
Waku, et al., "An Amorphous Ceramic Al32.4Er7.6O60 Fiber with Large Viscous Flow Deformation and a High-Strength Nanocrystallized Ceramic Fiber", Journal of Materials Science, vol. 36, No. 10, (May 2001), pp. 2435-2440.
Wallenberger et al., "Strong, Small Diameter, Boron Fibers by LCVD", Materials Letters, vol. 14 (1992), pp. 198-202.
Wallenberger, Frederick T., "Inorganic Fibres and Microfabricated Parts by Laser Assisted Chemical Vapour Deposition (LCVD): Structures and Properties*", Ceramics International, vol. 23, (1997), pp. 119-126.
Wang, Mengxiao, M.S., "UV Laser-Assisted Diamond Deposition", The Graduate College at the University of Nebraska, (Nov. 2014), (100 pages), http://digitalcommons.uni.edu/cgi/viewcontent.egi?article=1068&context=elecengtheses.
Wang, et al., "Synthesis of ZrC—SiC Powders from Hybrid Liquid Precursors with Improved Oxidation Resistance", Journal of the American Ceramic Society, vol. 98, No. 1, (Jan. 2015), pp. 197-204.
Wen, et al., "Interfacial Microstructure and Reaction of BN-Coated Single Crystal Al2O3 Fiber Reinforced NiAl Matrix Composites", Journal of Materials Science, vol. 37, No. 6, (Mar. 2002), pp. 1253-1258.
Zedlitz et al., "Properties of Amorphous Boron Nitride Thin Films", 1996, Journal of Non-Crystalline Solids, p. 198-200 (Year: 1996).
Zhang, et al., "Ferromagnetism Induced by Intrinsic Defects and Boron Substitution in Single-Wall SiC Nanotubes", Journal of Physical Chemistry, vol. 115, No. 35, (Sep. 2011), pp. 9987-9992.
Zimmerman, et al. "Fragmentation-Driven Grain Refinement in Directional Solidification of AlCu10wit-% Alloy at Low Pulling Speeds", Acta Materialia, vol. 126, (2017) pp. 236-250.
Harrison et al., "High Purity Ingot for Wafer Production", U.S. Appl. No. 17/580,990, filed Jan. 21, 2022 (34 pages) (Year: 2022).
International Search Report & Written Opinion for PCT Application No. PCT/US2022/71655, dated Aug. 16, 2022 (11 pages) (Year: 2022).

* cited by examiner

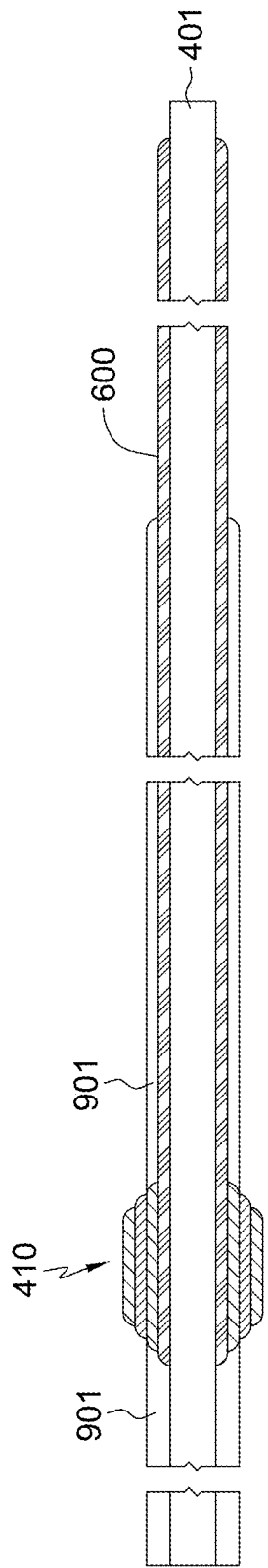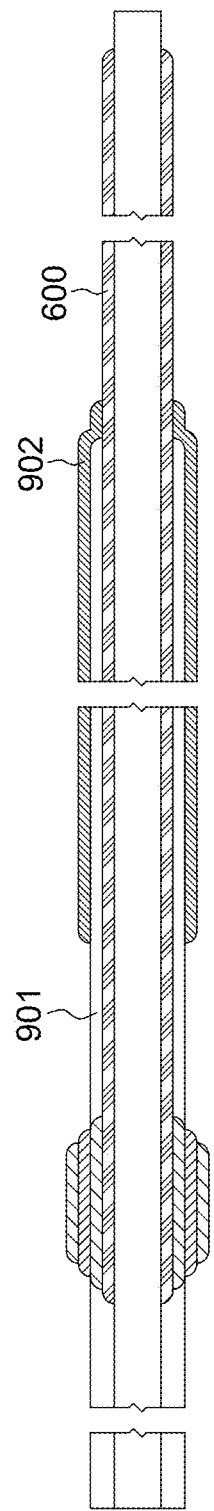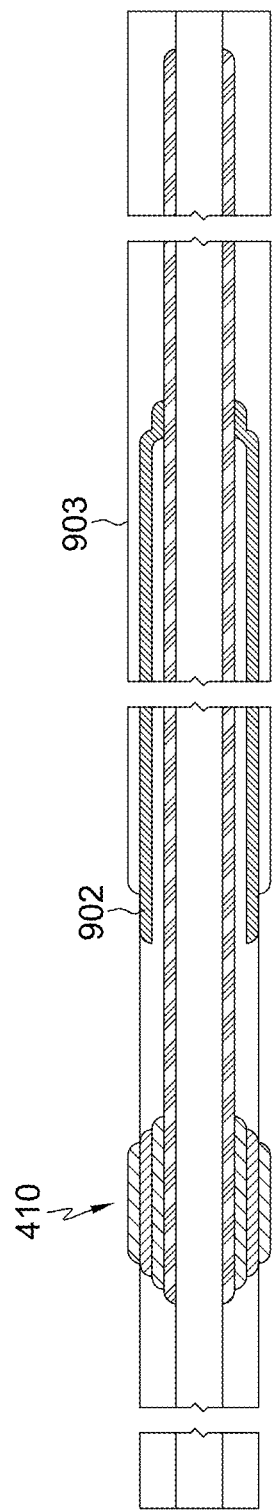

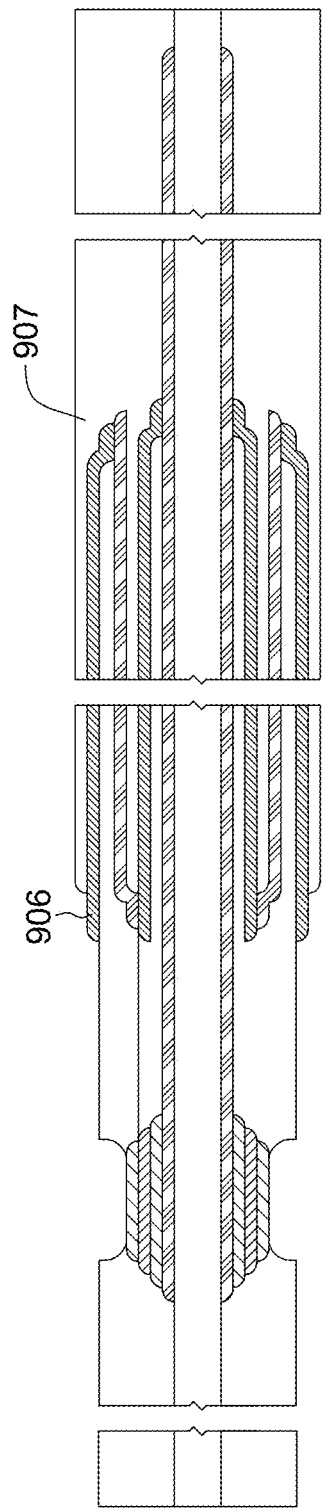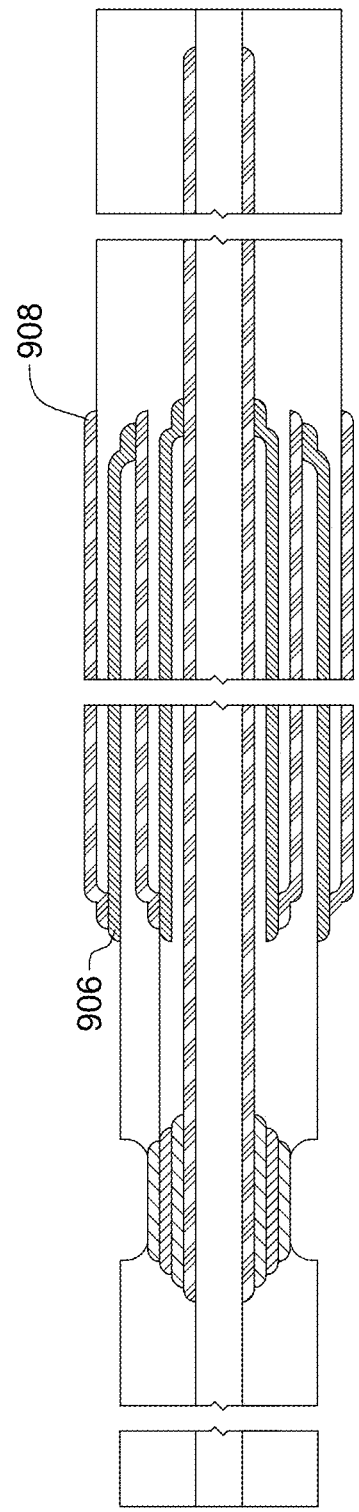

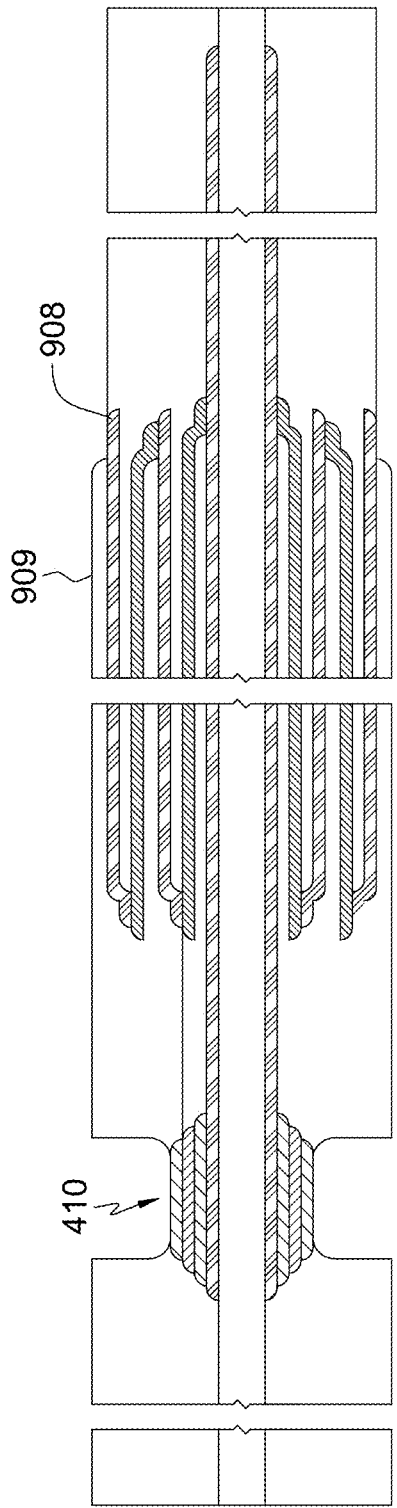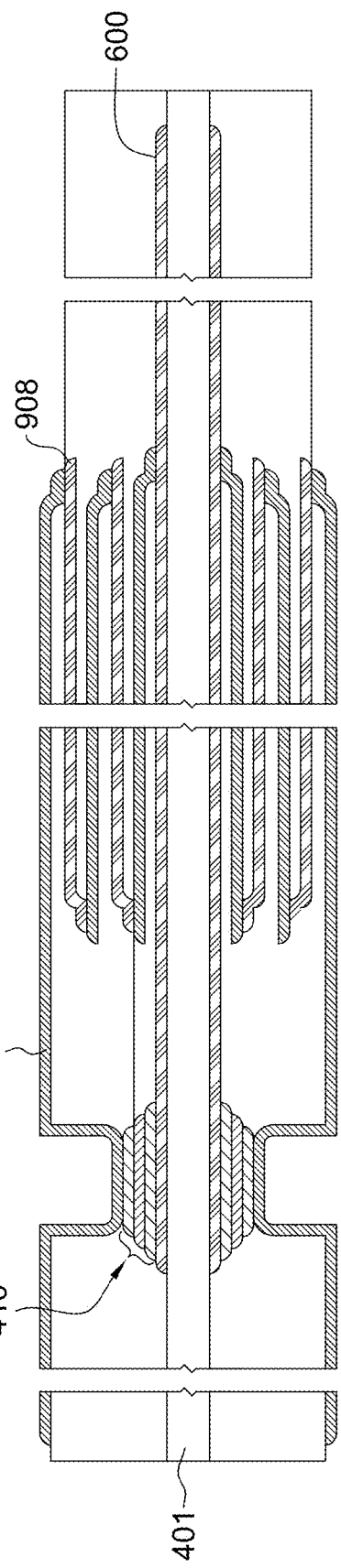

FIBER STRUCTURES WITH EMBEDDED SENSORS

CROSS-REFERENCE TO RELATED APPLICATIONS

This application claims the benefit of U.S. Provisional Application Ser. No. 63/212,799, filed Jun. 21, 2021, entitled "Smart Fibers Making Intelligent Composites, Including a Fiber Micro-Embedded Wireless Heat Flux Sensor Network", which is incorporated herein by reference in its entirety. Further, this application also relates to the following U.S. Letters Patents and/or U.S. Patent Publications, each of which of which is hereby incorporated herein by reference in its entirety: U.S. Pat. No. 10,047,015 B2, issued Aug. 14, 2018, and entitled "High Strength Ceramic Fibers and Methods of Fabrication"; U.S. Pat. No. 10,546,661 B2, issued Jan. 28, 2020, and entitled "An Additive Manufacturing Technology for the Fabrication and Characterization of Nuclear Reactor Fuel"; U.S. Ser. No. 15/592,726, filed May 11, 2017, published Nov. 16, 2017, as U.S. Patent Publication No. 2017/0331022 A1, and entitled "Multilayer Functional Fiber and Method of Making"; and U.S. Ser. No. 16/019,839, filed Jun. 27, 2018, published on Dec. 27, 2018, as U.S. Patent Publication No. 2018/0370860 A1, and entitled "Functional High-Performance Fiber Structure".

STATEMENT REGARDING GOVERNMENT RIGHTS

Certain aspects of this invention were made with United States Government support under a U.S. Department of Energy Award DE-SC0011954. Accordingly, the U.S. Government may have certain rights in this invention.

BACKGROUND

The present invention relates generally to the field of raw materials in fiber form, fibers for reinforcing material, and more specifically, to printed fibers with enhanced functionalities, such as, for instance, for structural reinforcement, sensing, actuating, energy absorption, energy storage, or combinations thereof.

SUMMARY

In accordance with one or more aspects, a method of producing a fiber structure with embedded sensor is provided, which includes: growing, using laser induced chemical vapor deposition, a scaffold fiber, and forming, by 1½-D printing using laser induced chemical vapor deposition, circuitry on the scaffold fiber to provide the fiber structure with embedded sensor. The forming includes printing a solid state oscillator about the scaffold fiber. The forming also includes printing a sensing device about the scaffold fiber electrically coupled to the solid state oscillator to effect, oscillations of the solid state oscillator. In addition, the forming includes printing an antenna about the scaffold fiber electrically connected to the solid state oscillator to facilitate in operation wireless transmitting of a signal from the fiber structure with embedded sensor. Advantageously, producing a fiber structure with embedded sensor incorporates enhanced functionality into a fiber, such as, for instance, sensing, actuating, stress-signaling, impact identification, flaw progression tracking, heat-flux mapping, energy absorption, energy storage, or combinations thereof. The fiber structure with embedded sensor can be used to generate data to facilitate predicting, for instance, a structural incident, before irreparable damage or injury.

In one or more embodiments, printing the solid state oscillator includes printing an annular solid state oscillator about the scaffold fiber. In one implementation, printing the annular solid state oscillator includes printing an annular Gunn-diode oscillator around the scaffold fiber. Advantageously, the annular solid state oscillator around the scaffold fiber, such as an annular Gunn-diode oscillator, is compact in size and readily integrated into the fiber structure to facilitate in operation wireless transmitting of a signal from the fiber structure with embedded sensor.

In one or more embodiments, printing the sensing device includes printing an annular thermopile around the scaffold fiber, where the annular thermopile generates a DC voltage based on a sensed temperature gradient. In one implementation, printing the annular thermopile around the scaffold fiber includes printing multiple series-connected annular thermocouples around the scaffold fiber. For instance, printing the multiple series-connected annular thermocouples around the scaffold fiber can include printing the multiple series-connected annular thermocouples as an annular stack of thermocouples around the scaffold fiber. Advantageously, printing the annular thermopile around the scaffold fiber provides an efficient mechanism for, for instance, sensing a temperature, sensing a temperature gradient or a heat-flux, along at least a portion of the scaffold fiber.

In one or more implementations, printing the antenna includes printing a dipole antenna around the scaffold fiber, where the dipole antenna includes a radially-inner, cylindrical-shaped conductive element extending axially along the scaffold fiber, and a radially-outer, cylindrical-shaped conductive element extending axially along the scaffold fiber. In one or more implementations, printing the antenna includes printing an annular dipole antenna around the scaffold fiber with an antenna length axially along the scaffold fiber defined relative to a specified peak frequency signal of the fiber structure with embedded sensor.

In one embodiment, the embedded sensor includes a wireless, annular heat-flux sensor configured to sense a temperature differential axially along at least a portion of the fiber structure with embedded sensor, where the wireless, annular heat-flux sensor includes the solid state oscillator, the sensing device, and the antenna.

In another aspect, a method of producing a composite structure is provided. The method includes forming a plurality of fiber structures with embedded sensors. Each fiber structure with embedded sensor of the plurality of fiber structures with embedded sensors includes a scaffold fiber, a solid state oscillator about the scaffold fiber, a sensing device about the scaffold fiber electrically coupled to the solid state oscillator to effect, at least in part, oscillations of the solid state oscillator, and an antenna about the scaffold fiber electrically connected to the solid state oscillator to facilitate in operation wireless transmitting of a signal from the fiber structure with embedded sensor. The method further includes embedding the plurality of fiber structures with embedded sensors within a material to fabricate the composite structure, wherein in operation, the plurality of fiber structures with embedded sensors provide respective wireless signal outputs through the material.

In a further aspect, a fiber structure with embedded sensor is provided. The fiber structure with embedded sensor includes a scaffold fiber, and circuitry formed around the scaffold fiber. The circuitry includes a solid state oscillator and a sensing device electrically coupled to the solid state oscillator to effect, at least in part, oscillations of the solid state oscillator. Further, the circuitry includes an antenna electrically connected to the solid state oscillator to facilitate in operation wireless transmitting of a signal from the fiber structure with embedded sensor.

Additional features and advantages are realized through the techniques described herein. Other embodiments and aspects of the invention are described in detail herein and are considered a part of the claimed aspects.

BRIEF DESCRIPTION OF THE DRAWINGS

One or more aspects of the present invention are particularly pointed out and distinctly claimed as examples in the claims at the conclusion of the specification. The foregoing and other objects, features, and advantages of the invention are apparent from the following detailed description taken in conjunction with the accompanying drawings in which:

FIG. 9A-9K illustrate one embodiment of a process of fabricating a sensing device about a scaffold fiber, such as depicted in FIG. 8, in accordance with one or more aspects of the present invention;

DETAILED DESCRIPTION

Figure 1:
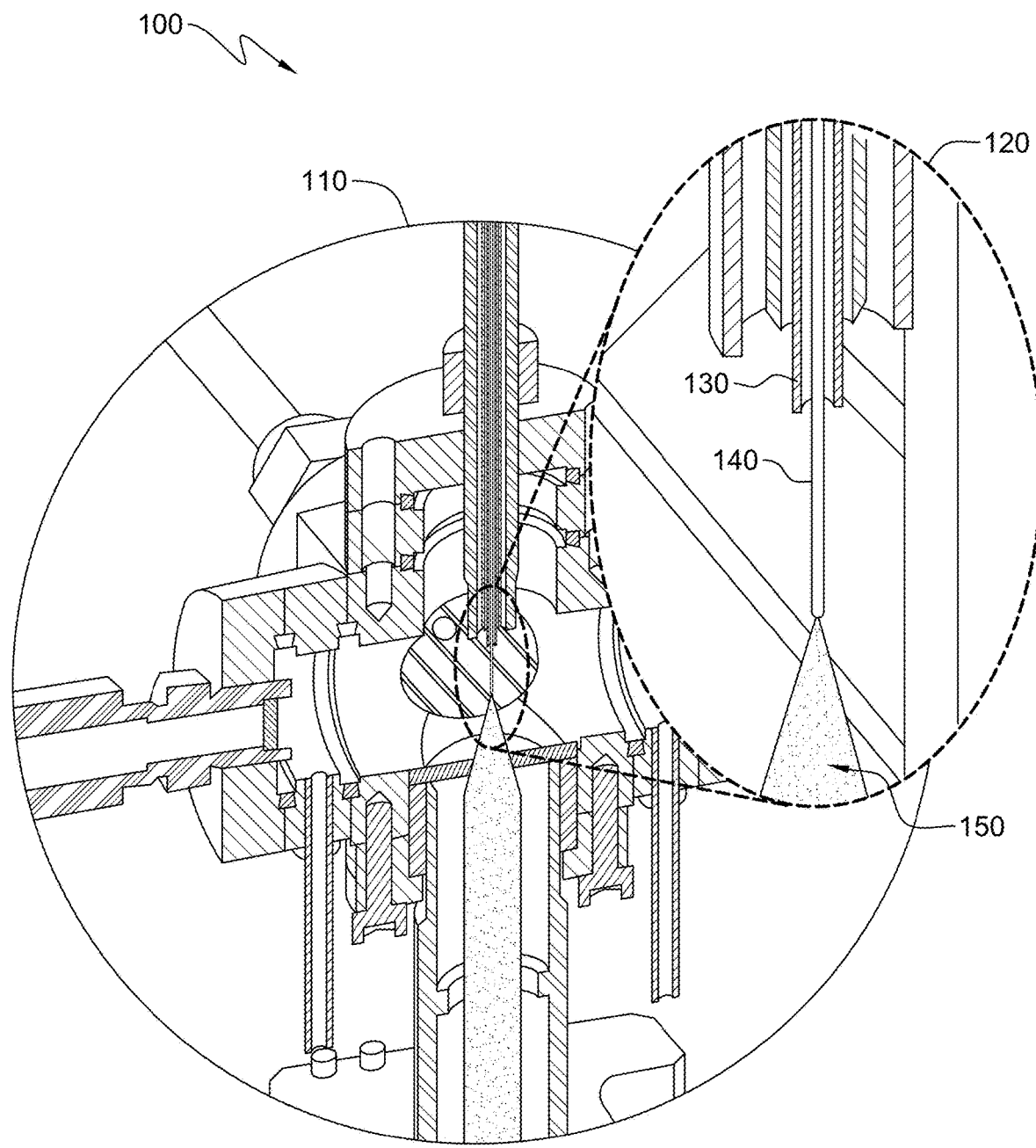
FIG. 1 is a schematic representation of a fiber reactor, showing a seed fiber substrate, a reactor into which precursor gasses are delivered, a focused laser beam impinging on the seed fiber, and one or more reactor windows that are transparent to the incoming laser beam wavelength and allow for monitoring of a fiber fabrication process, in accordance with one or more aspects of the present invention.

Aspects of the present invention and certain features, advantages and details thereof, are explained more fully below with reference to the non-limiting example(s) illustrated in the accompanying drawings, which may not be drawn to scale for ease of understanding. Descriptions of well-known systems, devices, fabrication and processing techniques, etc., are omitted so as to not unnecessarily obscure the invention in detail. It should be understood, however, that the detailed description and the specific example(s), while indicating aspects of the invention, are given by way of illustration only, and are not by way of limitation. Various substitutions, modifications, additions, and/or arrangements, within the spirit and/or scope of the underlying inventive concepts will be apparent to those skilled in the art from this disclosure. Note further that numerous inventive aspects and features are disclosed herein, and unless inconsistent, each disclosed aspect or feature is combinable with any other disclosed aspect or feature as desired for a particular application of, for instance, fabricating fiber structures with embedded sensors, and composite structures incorporating fiber structures with embedded sensors, such as described herein.

Aspects of the present invention are built upon an advanced manufacturing paradigm, inspired from cross-cutting advances in additive manufacturing (AM), micro-electromechanical-systems (MEMS) design and nano-fabrication, and ceramic matrix composites (CMCs).

Before describing a detailed embodiment of the novel fiber structure with embedded sensor, certain definitions are provided to aid in the description.

Additive manufacturing (AM) is a technology whereby constituent materials are joined together to form a desired object, usually under computer control. The constituents can come in the form of elemental molecules, point-like elements such as powders, line-like elements such as fibers, filaments, and extruded pastes, surface-like elements such as tapes and sheets, or volume-like elements such as bricks. Examples of additive manufacturing processes that proceed from elemental molecules include Chemical Vapor Deposition (CVD) or Physical Vapor Deposition (PVD) used in producing microelectronics. Numerous additive manufacturing processes proceed from flat layers of powder where individual grains are joined together selectively and bonded to the underlying layer to form an incremental cross-sectional layer of the object under construction. Filament winding and fused deposition modeling are examples of additive manufacturing processes where the constitutive material is brought in as a line-like element. Tape layup and laminated object manufacturing are examples of additive manufacturing processes where the constitutive elements are brought in as sheet-like elements.

When additive manufacturing processes build up a material object in layers, the technique is usually referred to as 3-D printing, by analogy to 2-D printing on a sheet of paper.

Additive manufacturing, as disclosed in certain embodiments herein, can have a great effect on fiber structures and fiber composite structures, where added sensing functionalities can be built into the constitutive fibers. The fundamental AM technique upon which embodiments of this invention can be built is known as Laser-Induced Chemical Vapor Deposition (LCVD).

The vast majority of previous additive manufacturing processes are strongly dependent upon the properties of the build material. For example, joining powders by locally melting them requires a precise knowledge of the melting point and a precise control of the local temperature during buildup. Very few additive manufacturing processes can function independently of material properties, and those that do are called "material agnostic".

LCVD is used in embodiments disclosed herein as a fundamental AM tool due to its near material independence, which is a rare property for AM processes. LCVD is a technique derived from CVD, used intensively in the microelectronics fabrication industry (aka "Chip Fab"). CVD builds up electronics-grade high-purity solid deposits from appropriate gas precursors. In its 75+ year history, Chip Fab has accumulated an impressive library of chemical precursors for a wide range of materials, numbering in the 10's of thousands. The main difference between CVD and LCVD resides in dimensionality and mass throughput. CVD is intended for 2-D film growth whereas LCVD is suited for one-dimensional filamentary structure processing such as disclosed herein. The dimensionality difference means that deposition mechanisms are greatly enhanced for LCVD vs. CVD, leading to deposited mass fluxes (kg/m2 s) that are 3 to 9 orders of magnitude greater. For example, diamond-like carbon filaments have been measured at linear growth rates upwards of 13 cm/s, which represents a 9 order of magnitude increase in mass flux compared to thin film CVD of the same material. Finally, compared to existing manufacturing, LCVD is essentially containerless, which virtually eliminates opportunities for material contamination by container or tool. Thus, according to embodiments disclosed herein, LCVD, and 1½D—printing, further described below, allow for the material of a fiber, and component layers deposited on a fiber, to be tightly controlled. Additionally, due to the change in focus of the laser and the containerless growth, the material of a fiber and/or component material being added to a fiber, is capable of being altered or completely changed to a new material system in situ, such as during growth of a fiber structure, allowing for nearly instantaneous changes to the material system of the fiber.

Many applications of aspects of the present invention can be implemented by material-agnostic AM processing, such as the capability to fabricate fiber structures with embedded sensors in a manner that is material agnostic.

As described herein, a new design space is used in one or more embodiments, from which manufacturing can emerge as an axiomatic-based science. The ability to print fibers, and print circuitry on the fibers, such as disclosed herein, utilizing (in one embodiment) fundamental properties that are formally defined herein as "1½-D Printing" AM (by analogy to 3-D printing).

To implement 1½-D printing, Laser Induced Chemical Vapor Deposition (LCVD) is chosen herein as the fundamental Additive Manufacturing (AM) tool for its near material independence—a rare property for AM processes. Such a process is said to be "material agnostic".

For the purpose of this application, the term "1½-D Printing" designates an AM process exhibiting the following defining properties:
1. Material-agnostic ability to grow fibers or filaments;
2. Ability to vary diameter and axis along the length of the fiber or filament;
3. Material-agnostic ability to vary composition along the length of the fiber or filament; and
4. Material-agnostic ability to deposit materials onto specific sections of fibers or filaments with a desired morphology, and thickness.

These four axiomatic properties constitute a set of manufacturing tools that defines a new range of sensor capable filamentary constructs, unleashing new designs, certain examples of which are discussed herein.

For instance, using embodiments described herein, there is an ability to grow filaments in a material-agnostic method or methods, meaning that the material or materials of a fiber, or filament, according to embodiments described herein, can be altered in stoichiometry, or completely changed during the growth of the fiber, or filament. For example, High Performance Fibers (HPFs) can be provided for expanding uses in many specialized applications, such as military and aerospace (turbo machinery, rockets, advanced structures), automobile, biomedical, energy, and other applications that require advanced materials with exceptional strength, stiffness, heat resistance, and/or chemical resistance. HPFs are sought when a combination of extreme material properties is required which cannot be met by existing metal filaments or by carbon, glass, vegetal, or mineral fibers. HPF composite systems disclosed herein generally include a plurality of fiber structures, distributed within a matrix material, such as a ceramic matrix composite (CMC).

Traditionally, fiber formation is often accomplished by passing a liquid precursor through a spinneret. For example, the spinneret is typically a plate with a pattern of tiny holes through which a liquid precursor is fed. Upon exit, the stream pattern gels into filaments called "green fibers". This process assumes that the fiber material can exist in either a liquid, gel, or plastic form that lends itself to flowing through a small opening. In many instances, and especially for refractory materials, such a liquid or near liquid state does not exist.

A better approach disclosed herein involves extracting a fiber (such as for use as a scaffold fiber) out of a laser focus where the fiber is created from surrounding fluid precursors. In one embodiment, a laser is focused on the fiber tip thereby heating the fiber to temperatures at which the precursors dissociate, and Chemical Vapor Deposition (CVD) takes place. The fiber grows in length and is pulled out of the reaction zone at the growth rate, resulting in the creation of an arbitrarily long monofilament fiber. This process technology, used according to embodiments of the current invention, is illustrated by FIG. 1.

FIG. 1 is a schematic of an exemplary process which utilizes (in one embodiment) a reactor 100, which is shown in partial cross-section view 110 to include an internal reactor chamber, and in enlarged view 120, a growth region within the chamber. As illustrated, a self-seeded fiber 140 grows towards an oncoming coaxial laser 150 and is extracted through an extrusion microtube 130. In one or more embodiments, CVD precursors are injected into the reaction zone from the extrusion microtube forming a small, high concentration plume around the reaction zone that feeds and convectively enhances growth. This plume can be embedded in a coaxial flow of inert gas that shields the reaction and carries away diluted by-products. This reactor design builds upon understanding of Laser Induced Chemical Vapor Deposition (LCVD) fiber growth, and is suited for rapid development of specialty filaments with diameters such as disclosed herein.

Further, note that large scale replication of fiber growth and fiber processing can advantageously be used, in one embodiment. Pure optical parallelization for fiber growth is one approach to mass production of fibers. For example, parallelization of the process technology illustrated by FIG. 1 can be pursued.

In pursuing large scale manufacturing objectives, however, certain features of the FIG. 1 approach should be preserved, such as:

Feature 1—Convection enhanced high-pressure precursor flow—has been shown to optimize single fiber growth.

Feature 2—Imaging at wavelengths that are specific to byproducts (e.g. Hydrogen at 656 nm)—provides for direct observability of fiber growth and has been used for process control.

Features 3 and 4 respectively—Containerless and material-agnostic—form the basis for a platform technology capable of processing a wide range of materials.

Figure 2:
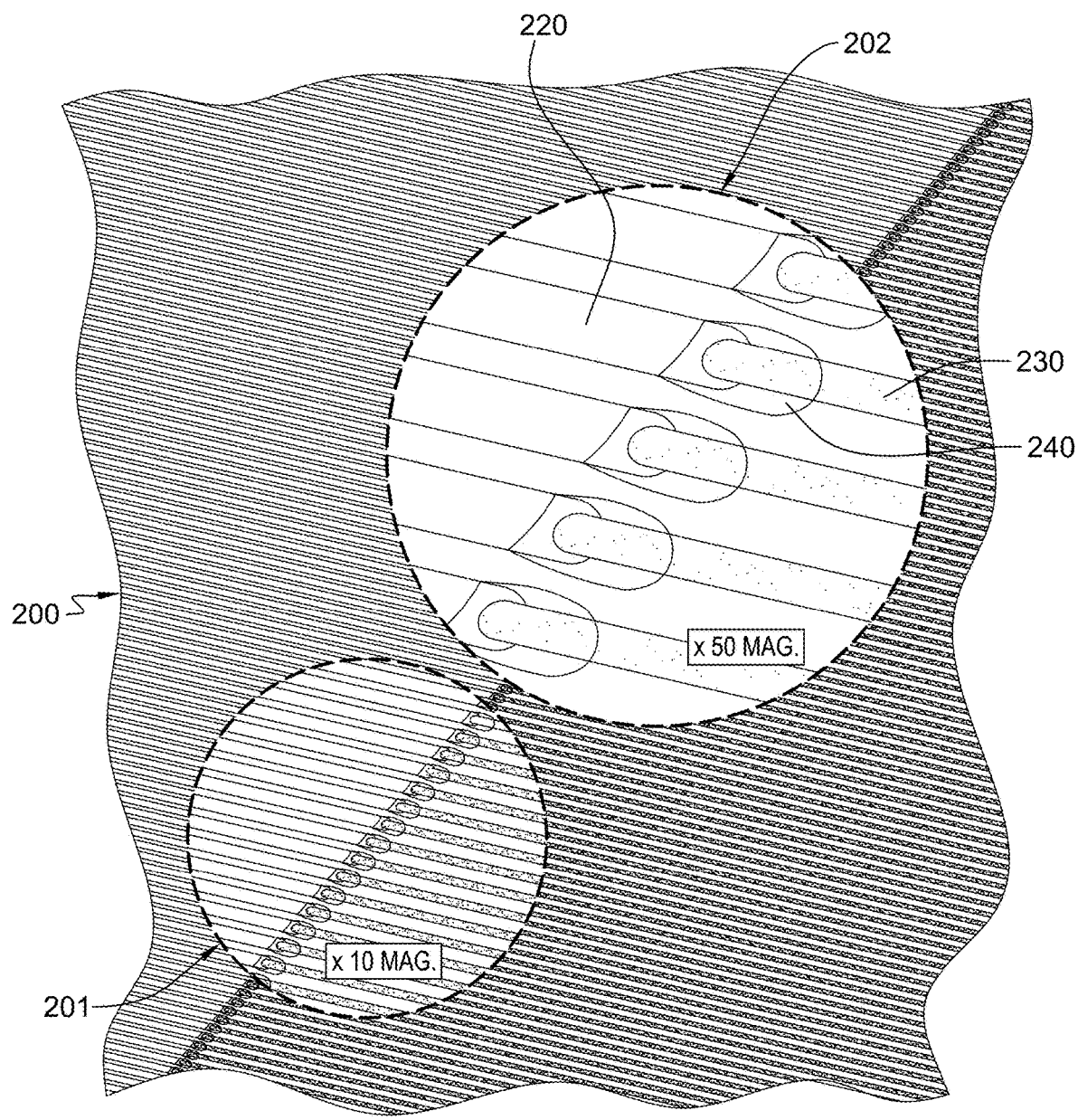
FIG. 2 is a schematic representation showing how fiber LCVD processing can be parallelized by multiplication of laser beams for use in a fiber structure fabrication process, in accordance with one or more aspects of the present invention.

The present invention, in one or more embodiments, can utilize a large array of independently controlled lasers, to grow a large array 200 of fibers 220 in parallel, as illustrated in FIG. 2. In one embodiment, fiber LCVD growth can be massively parallelized from a filament lattice by multiplication of laser beams 230 that include a plasma 240 around the tip of each fiber 220. By way of example, the array of fibers are shown with 10× magnification 201, and 50× magnification 202 in FIG. 2.

Figure 3:
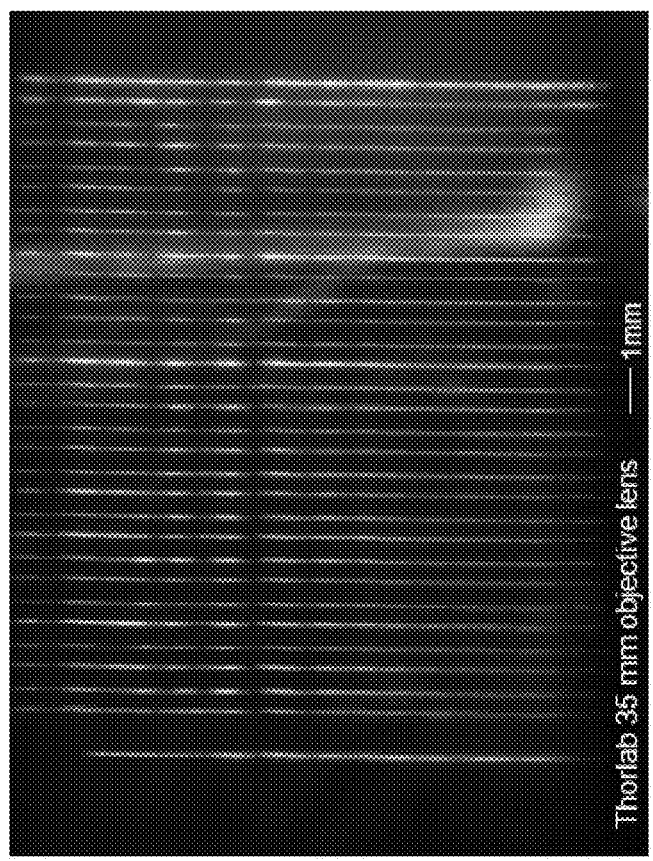
FIG. 3 is an example of parallel LCVD growth of carbon fibers, which can be used as scaffold fibers in one embodiment of a fiber structure fabrication process, in accordance with one or more aspects of the present invention.
Figure 3:
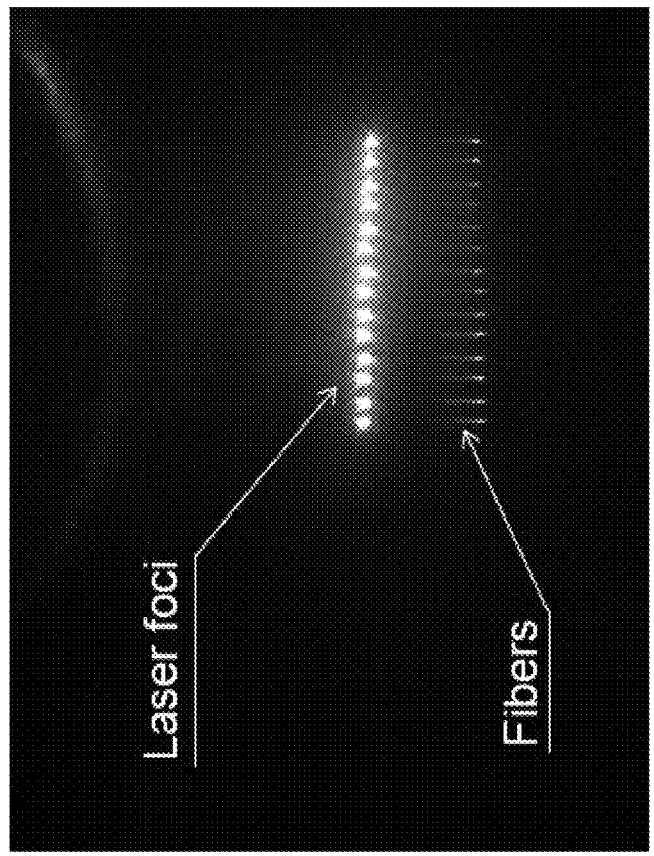

Using a Computer to Plate (CtP) (e.g., Quantum Well Intermixing (QWI)) laser array for LCVD combined with the use of a shallow depth of laser focus, provides beneficial results. In one embodiment, the shallow depth of laser focus can be 100 microns or less in total linear length of depth of focus. By way of example, FIG. 3 shows one embodiment of parallel LCVD growth of carbon fibers using a unit with multiple lasers, for instance 64 or more. The left figure shows fibers during growth, and the right figure shows the resulting grain fibers. Note that the diameter and length of fibers grown using laser induced chemical vapor deposition as scaffold fibers (such as disclosed herein) can vary. In one or more embodiments, the diameter of the grown fiber is less than 100 microns, for instance, 50 microns or less and in particular, in the range of 20-30 microns.

A scaffold fiber diameter in the range of 50 microns or less has advantages during fabrication of circuitry on the scaffold fiber using, for instance, 1½-D printing and laser induced chemical vapor deposition, as disclosed herein. Advantageously, such scaffold fibers have a small enough thermal mass that applying a laser to one side of the fiber substantially uniformly heats the fiber radially in the region of the laser induced deposition, and therefore facilitates uniform deposition of the desired layer around the scaffold fiber. In one or more embodiments, layers of circuitry can be added to the scaffold fiber which can have (in one embodiment) a total thickness that is a fraction of the diameter of the scaffold fiber. For instance, in one embodiment, the total thickness of the added layers of circuitry to achieve the desired fiber structure with embedded sensor can be 5 microns or less, such as in the range of 2-4 microns, with a scaffold fiber diameter in the range of 20-30 microns, such that the small thermal mass is maintained throughout the build process. The length of the fiber can vary depending on the application, such as the particular composite structure application within which fiber structures are to be embedded.

In prior uses, the laser beam has been focused to a diffraction limited spot with long Raleigh range. In accordance with the present invention, not only is the focus intense enough to sustain CVD, but the shallow depth of focus means that fibers can only grow in a small region in the front and back of the image plane. This goes against commonly accepted practice in LCVD where long depths of field are favored to maximize the growth region. The advantage of a shallow depth of field is important because of the level of control it can afford. For example, if one fiber stopped growing for any reason, the focus can be moved back to that fiber tip. All other growths would stop and then restart as the lagging fiber is pulled back to the same level as the others.

The effect of a shallow depth of focus, according to some embodiments of the invention, is also illustrated in FIG. 3. In particular, significant benefits are evident in FIG. 3; that is, fibers are grown in unison, and to the same height. This is an unexpected benefit of source imaging over diffraction limited optics because the depth of focus is 5 to 30 times (vertical and horizontal, respectively) shallower than the Rayleigh range of an equivalent diffraction limited focus. This turns out to be advantageous as fibers quickly grow in and out of focus. This makes it possible to track fiber growth, and even backtrack to retrieve fibers that stopped growing without affecting any of the other already grown fibers. This unique feature of the CtP laser bars is expected to represent a major advantage in controlling future parallel LCVD growth for fiber arrays.

By way of additional enhancement, disclosed herein are fiber structures with embedded sensors, as well as composite structures incorporating fibers with embedded sensors, and methods of fabrication thereof. In one or more embodiments of making a fiber structure with embedded sensor, a scaffold fiber is obtained, such as grown as described herein using laser induced chemical vapor deposition, and then used to form, by 1½-D printing using laser induced chemical vapor deposition, circuitry on the scaffold fiber to provide the desired fiber structure with embedded sensor. The forming includes, in one or more implementations, printing a solid state oscillator about the scaffold fiber, printing a sensing device about the scaffold fiber electrically coupled to the solid state oscillator to effect, at least in part, oscillations of the solid state oscillator, and printing an antenna about the scaffold fiber electrically connected to the solid state oscillator to facilitate in operation wireless transmitting of a signal from the fiber structure with embedded sensor. In one or more embodiments, the sensing device is a heat-sensing device, such as a thermopile formed of a plurality of annular thermocouples in a stack around the scaffold fiber.

Figure 4A:
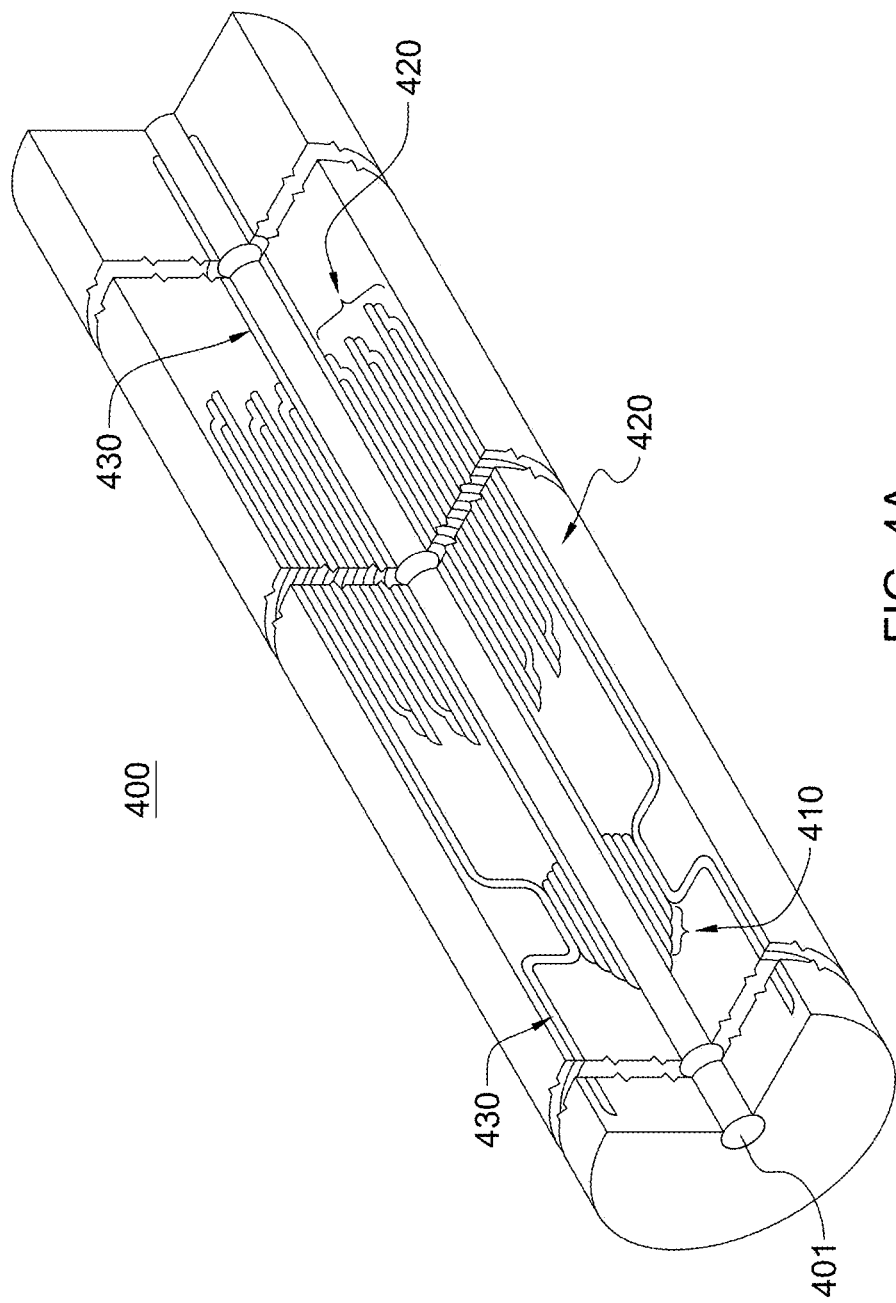
FIG. 4A depicts one embodiment of a fiber structure with embedded sensor, in accordance with one or more aspects of the present invention.
Figure 4B:
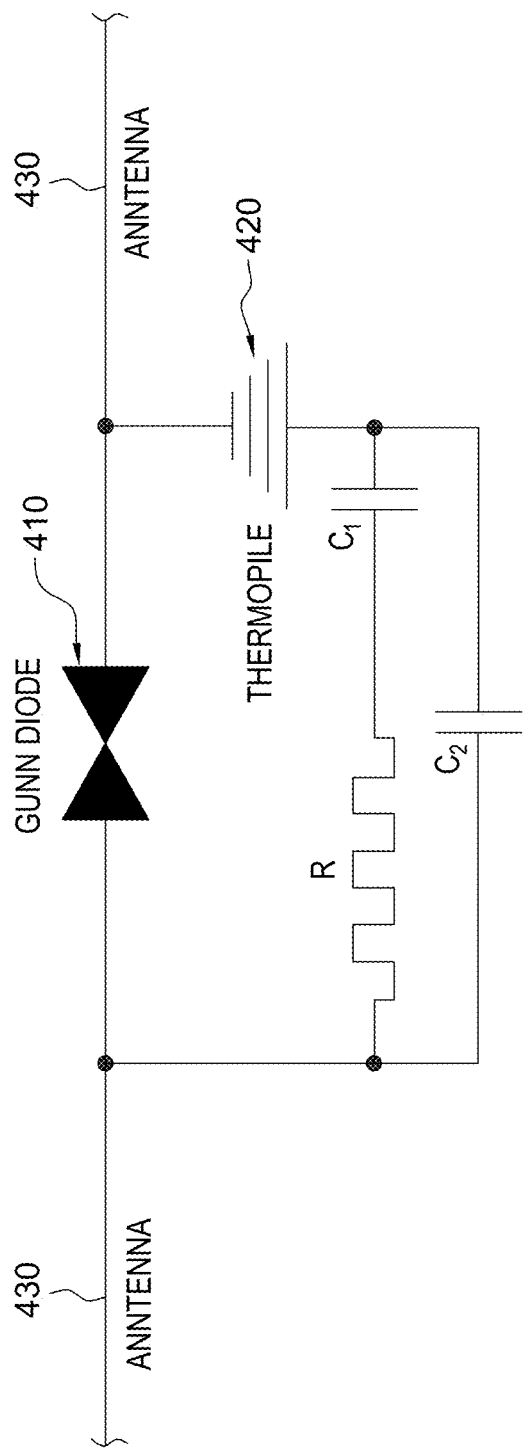
FIG. 4B is a schematic of one embodiment of the embedded sensor of FIG. 4A, in accordance with one or more aspects of the present invention.

FIGS. 4A-4B depict one implementation of such a fiber structure with embedded sensor. Referring to FIG. 4A, the fiber structure with embedded sensor 400 includes, in one embodiment, a scaffold fiber 401 grown, for instance, using laser induced chemical vapor deposition, with a diameter of 50 microns, or less, such as in the range of 20-30 microns. In one or more implementations, 1½-D printing using laser induced chemical vapor deposition is used to form circuitry on scaffold fiber 401. The circuitry includes, in one embodiment, an annular solid state oscillator 410 around scaffold fiber 401, a sensing device, such as an annular thermopile 420 around scaffold fiber 401, that is electrically coupled to solid state oscillator 410 to effect, at least in part, oscillations of the solid state oscillator, and an antenna, such as a dipole antenna 430 including two cylindrical-shaped conductive elements or tubes extending (for instance, in opposite directions) along the scaffold fiber, one radially inner and the other radially outer, in one embodiment.

A schematic embodiment of fiber structure with embedded sensor 400 of FIG. 4A is depicted in FIG. 4B. As noted, and by way of example only, the formed circuitry on the scaffold fiber can include a thermopile 420 which produces a voltage bias dependent on an applied thermal gradient along the fiber in the axial direction. The voltage bias is applied to solid state oscillator 410, such as a Gunn-diode oscillator, which causes it to oscillate in the microwave band. The oscillation spectrum is thus temperature-gradient-dependent in this embodiment. Further, dipole antenna 430 in operation transmits the signal wirelessly to a receiver. Since Gunn-diodes are sensitive to manufacturing variations, no two devices will have exactly the same spectral response. Hence, devices can be mass produced using the same process, yet each device will have its own signature response.

FIG. 4B represents the electronic circuit equivalent to FIG. 4A, in which R represents the composite electrical resistance of the circuit. C1 represents the parasitic capacitance induced by the annular stacking of thermopile components. C2 represents the parasitic capacitance of the rest of the circuit, including the Gunn-diode oscillator and dipole antenna, and the antenna represents the inductive element of the circuit.

In one or more embodiments, note that the solid state oscillator can be an annular solid state oscillator around the scaffold fiber. For instance, the solid state oscillator can be an annular Gunn-diode oscillator about the scaffold fiber, such as a gallium nitride (GaN) or gallium arsenide (GaAs)-based component.

In one or more implementations, the sensing device is a thermal sensor, such as an annular thermopile about the scaffold fiber, where the annular thermopile generates a DC voltage dependent on a sensed axial temperature gradient along a portion of the scaffold fiber. In one embodiment, printing the annular thermopile around the scaffold fiber can include printing multiple series-connected annular thermocouples around the scaffold fiber. In one or more implementations, printing the multiple series-connected annular thermocouples around the scaffold fiber includes printing the multiple series-connected annular thermocouples as an annular stack of thermocouples around the scaffold fiber, one embodiment of which is depicted in FIG. 4A.

As noted, in one or more embodiments, the antenna is a dipole antenna that extends axially along at least a portion of the scaffold fiber. In one or more embodiments, the dipole antenna includes a radially-inner, cylindrical-shaped conductive element extending axially along a portion of the scaffold fiber, and a radially-outer, cylindrical-shaped conductive element extending axially along another portion of the scaffold fiber. In one or more implementations, the annular dipole antenna has an antenna length axially along the scaffold fiber defined relative to a specified peak frequency signal of the fiber structure with embedded sensor.

In one or more embodiments, the embedded sensor is a wireless, annular heat-flux sensor configured to sense a temperature differential axially along at least a portion of the fiber structure with embedded sensor. The wireless, annular heat-flux sensor includes the solid state oscillator, the sensing device, and the antenna, in one embodiment.

Note that in operation, the heat-sensing device, or thermopile in the embodiment of FIG. 4A, produces a voltage bias dependent on an applied thermal gradient along the portion of the fiber structure occupied by the thermopile. The produced voltage is applied to the solid state oscillator (e.g., Gunn-diode), causing it to oscillate in, for instance, the microwave band. The oscillation spectrum is thus temperature-gradient dependent. The dipole antenna can wirelessly transmit the oscillation signal to a receiver. This operational description of the sensor represents an autonomous mode of operation, where the thermal gradient results in the generation and output of a corresponding signal.

In another mode of operation, referred to herein as a passive mode of operation, an electromagnetic signal, such as a microwave signal, can be used to interrogate the fiber structure with embedded sensor to generate thermal-sensor data. In this mode, externally-generated electromagnetic radiation is absorbed by the dipole antenna and transmitted to the solid state oscillator (e.g., Gunn-diode), which causes oscillation excitation. This oscillation is impacted by the direct current (DC) input bias from the sensing device (e.g., thermopile) that is generated by the thermal-gradient condition. The frequency altered oscillation is then transmitted back to the dipole antenna, which releases electromagnetic radiation that is different from the interrogation radiation frequency, and thus can be measured and quantified for analysis, such as temperature analysis in the case of a heat sensor.

Figure 5:
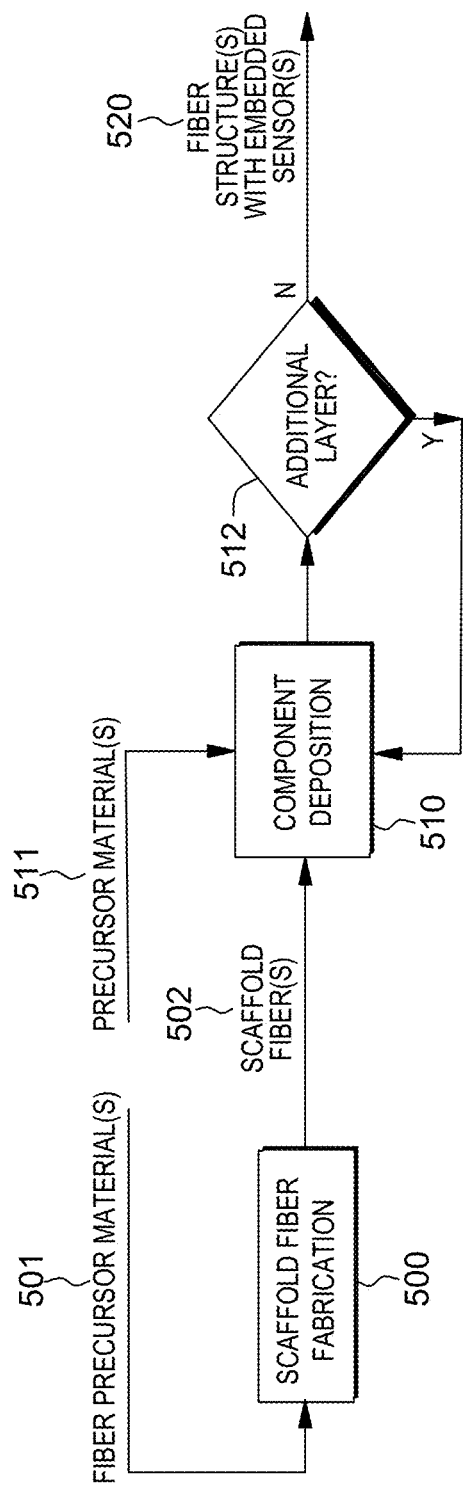
FIG. 5 depicts one embodiment of a process for producing fiber structures with embedded sensors, in accordance with one or more aspects of the present invention.

FIG. 5 depicts one embodiment of a process for producing fiber structures with embedded sensors, in accordance with one or more aspects disclosed herein. Initially, a scaffold fiber is obtained, e.g., fabricated 500 using one or more fiber precursor materials 501 and laser induced chemical vapor deposition, such as described herein. In one or more embodiments, the scaffold fiber 502 is an ordinarily solid material selected from a group including boron, carbon, aluminum, silicon, titanium, zirconium, niobium, molybdenum, hafnium, tantalum, tungsten, rhenium, osmium, nitrogen, oxygen, and combinations thereof. For instance, in one or more embodiments, the scaffold fiber can be fabricated as a silicon carbide fiber, a silicon nitride fiber, a boron carbide fiber, etc. As noted, in one or more implementations, the fiber is sized to have a thermal mass which facilitates, for instance, uniform annular deposition of the desired component layers using LCVD processing, such as described herein. In one or more embodiments, the fiber diameter is 50 microns or less, such as in the range of 20-30 microns, which allows for substantially instantaneous radial heating of a laser-applied portion of the fiber, and thus, uniform deposition of the desired component layer(s) around the circumference of the fiber at that location.

In one or more implementations, 1½-D printing using laser induced chemical vapor deposition is employed in depositing component layers onto the fiber, to define the desired circuitry on the scaffold fiber, such as the annular circuitry described herein. As illustrated in FIG. 5, in one embodiment, one or more component depositions 510 occur using LCVD and appropriate precursor materials 511 for the material being deposited. In one or more embodiments, the formation of annular thermal sensors such as disclosed herein on a scaffold fiber using LCVD can entail the spot-coating of consecutive layers on the fiber. This process can be accomplished, in one embodiment, using separate deposition chambers, lined up sequentially, in order to deposit each required material layer that constitutes the makeup of the desired circuit element(s). Each chamber can be filed with the appropriate selected gas precursor(s) 511 in order to deliver the needed elements for the desired chemical composition of the intended layer to be formed. The fiber scaffold can be conveyed through gas seals from one chamber to the next, allowing for isolation of the gas environments from one chamber to the next, and preventing cross-contamination. In one or more embodiments, after sensor component deposition 510, the process determines whether one or more additional component layers are needed 512, and if "yes", performs the deposition for a next component layer. Once all components have been formed about the scaffold fiber, the fiber structure with embedded sensor is output.

Figure 6:
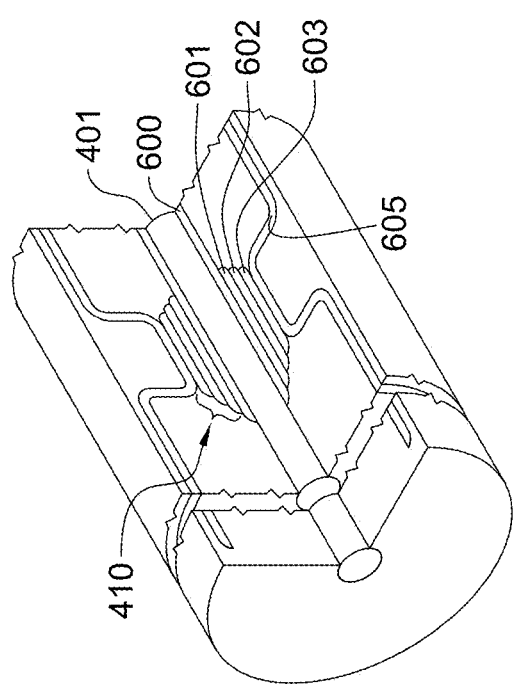
FIG. 6 is a partially cut-away view of one embodiment of a solid state oscillator about a scaffold fiber of a fiber structure with embedded sensor, in accordance with one or more aspects of the present invention.

FIG. 6 is an enlarged, partial cutaway depiction of a solid state oscillator 410 about a scaffold fiber 401 of a fiber structure with embedded sensor, such as described above in connection with FIGS. 4A-5. In one embodiment, solid state oscillator 410 is, for instance, a Gunn-diode fabricated from thin annular component films around scaffold fiber 401. By way of example, an annular first terminal 601, such as an anode, can be formed over (and on) an inner conductive element 600 of the antenna structure, itself deposited in a cylindrical shape around scaffold fiber 401. An annular resonant doped region 602 is deposited around first terminal 601, followed by an annular second terminal 603, such as a cathode, deposited around the resonant doped region 602. Note that advantageously, fabricating the solid state oscillator (for instance, Gunn-diode oscillator) in an annular shape allows ready integration of the oscillator into the fiber structure, such as a flexible fiber structure, and provides a very compact electronic oscillator.

By way of example, FIGS. 7A-7E illustrate further details of one embodiment of a process of fabricating a solid state oscillator, such as solid state oscillator 410 of FIGS. 4A & 6, about scaffold fiber 401, in accordance with one or more aspects of the present invention.

Figure 7A:
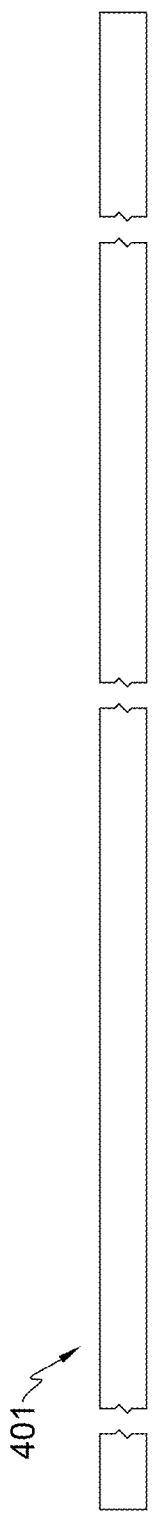
FIGS. 7A-7E illustrate one embodiment of a process of fabricating a solid state oscillator about a scaffold fiber, such as depicted in FIG. 6, in accordance with one or more aspects of the present invention.

As illustrated in FIG. 7A, a scaffold fiber 401 is obtained. By way of example, the obtained fiber can be formed of an electrically insulating material, such as silicon carbide, silicon nitride, etc. An electrically-insulating scaffold fiber can be grown, for instance, via laser induced chemical vapor deposition, such as described herein. In one or more other embodiments, scaffold fiber 401 can be a fiber formed of a conductive material that has an insulator layer over the fiber. As noted, in one or more implementations, the scaffold fiber has a diameter of 50 microns or less, such as in the range of 20-30 microns, to facilitate (in one embodiment) 1½-D printing using laser induced chemical vapor deposition of uniform thickness component layers onto the scaffold fiber, and thereby facilitate embedding the desired sensor circuitry within the fiber structure. Using a scaffold fiber with a diameter, for instance, in the range of 20-30 microns, results in a fiber with a small enough thermal mass so that the heat from the applied laser beam will propagate radially across the fiber and result in no significant difference in temperature around the circumference of the fiber where the beam is applied.

Figure 7B:

In FIG. 7B, a radially-inner, cylindrical-shaped conductive element 600 of the dipole antenna has been formed around scaffold fiber 401. As discussed, in one operational mode, the dipole antenna is configured to transmit generated radiation in order to achieve the desired wireless communication. The material performance desired centers on electrical conductivity, and as such, typically conductors such as copper (Cu) and silver (Ag) are viable candidates, as well as other more complex compositions such as zirconium diboride ($ZrB_2$). For instance, copper can be deposited from a copper chloride (CuCl) precursor. In one embodiment, the antenna can be designed to generate a microwave signal with a frequency in the range of a gigahertz to 100 gigahertz, and as such, the length of the antenna structure can be on the order to 0.5 to 15 centimeters, depending on the length of the fiber. Further, thickness of the radially-inner, cylindrical-shaped conductive element 600 can vary depending on the sensor application, with a thickness ranging from 0.1 micron-5 microns in many applications, such as in the range of 0.5 micron-1 micron.

Figure 7C:
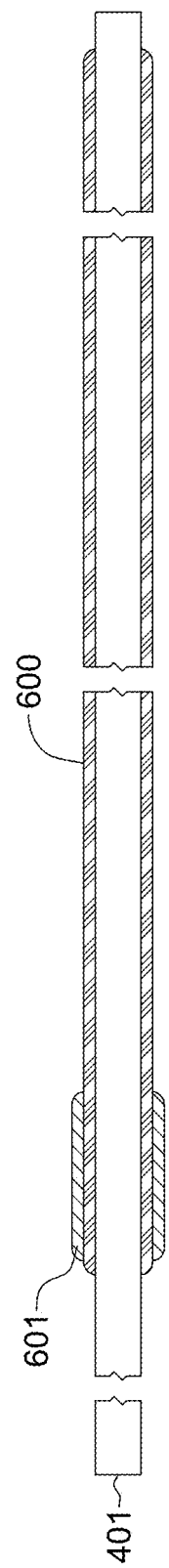

As shown in FIG. 7C, in one or more embodiments, an annular first terminal 601 of the solid state oscillator is deposited, for instance, using LCVD processing such as described herein, on conductive element 600. In one embodiment, annular first terminal 601 can be, for instance, an anode, such as the anode of an annular Gunn-diode. Annular first terminal 601 is formed on and around a portion of radially-inner, cylindrical-shaped conductive element 600, which itself a cylindrical film around scaffold fiber 401. In this manner, annular first contact 601 is electrically coupled to the radially-inner conductive element 600. In one or more embodiments, annular first terminal 601 is formed as a III-V semiconductor, which can be, for instance, gallium nitride (GaN), gallium arsenide (GaAs), a nitrogen-doped silicon carbide (SiC), etc., each of which can be deposited by LCVD. Thickness of annular first terminal 601 can vary and may be, in one implementation, approximately 1-2 microns. Note that the choice of semiconductor material used for the first terminal will affect the resonant frequency of the solid state oscillator in operation.

Figure 7D:
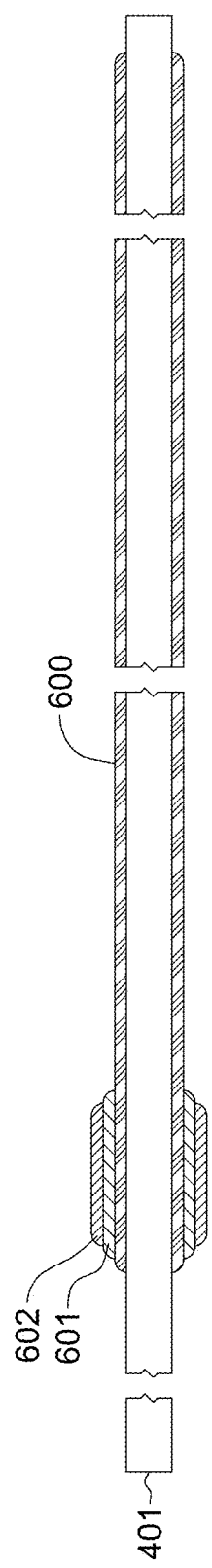

In FIG. 7D, an annular active layer 602 has been deposited as the resonant region. In one embodiment, 1½-D printing using LCVD is used to deposit annular active layer 602 over first terminal 601, which is followed by deposition of an annular second terminal 603 (FIG. 7E) over active layer 602. In one embodiment, the length of active layer 602 in the axial direction of the fiber is less than that of first terminal 601, and the length of second terminal 603 is less than that of active layer 602, which ensures that each layer of the oscillator is shorter in length than the layer below it. This advantageously prevents the terminals, that is, the anode and cathode, from being in direct contact, and ensures that current passes through active layer 602. In one or more embodiments, annular active layer 602 can be, for instance, about 100 nanometers thick, and annular second terminal 603 can be, for instance, 1-2 microns thick. As discussed herein, in one or more embodiments, the individual layers are annular in shape, resulting in an annular solid state oscillator, such as an annular Gunn-diode oscillator, being disposed on scaffold fiber 401. The structure can be fabricated using 1½-D printing and laser induced chemical vapor deposition with appropriate precursors, as discussed herein.

Note that the selected functional material(s) serves as the resonant cavity of the Gunn-diode. The frequency of radiation generated is determined by the thickness of the cavity layer and the characteristic electron mobility of the cavity material. For instance, it is estimated that using a gallium arsenide (GaAs) resonant cavity that radiates in a microwave frequency range from 2 to 80 gigahertz (GHz) requires a 75-125 nanometer thick layer to be formed on the annular design. In order to form the Gunn-diode element in the circuit, arsenic and gallium precursor gases can be used, as well as an appropriate composition to form the connecting antenna electrodes, such as tungsten. Arsine ($AsH_3$) and trimethylgallium ($Ga(CH_3)_3$) are example precursor gases available in the library of CVD materials. The connecting electrodes (e.g., conductive antenna elements) can be formed using tungsten hexafluoride ($WF_6$), a halogen gas. The use of a fluorine-based precursor necessitate the use of specific LCVD system components to address the chemical attack of fluorine gas and avoid any damage, such as calcium fluoride (CaF$_2$) or magnesium fluoride (MgF$_2$) optics for the reactor chamber and potential fluorine passivation of metal surfaces in the gas delivery system.

Figure 8:
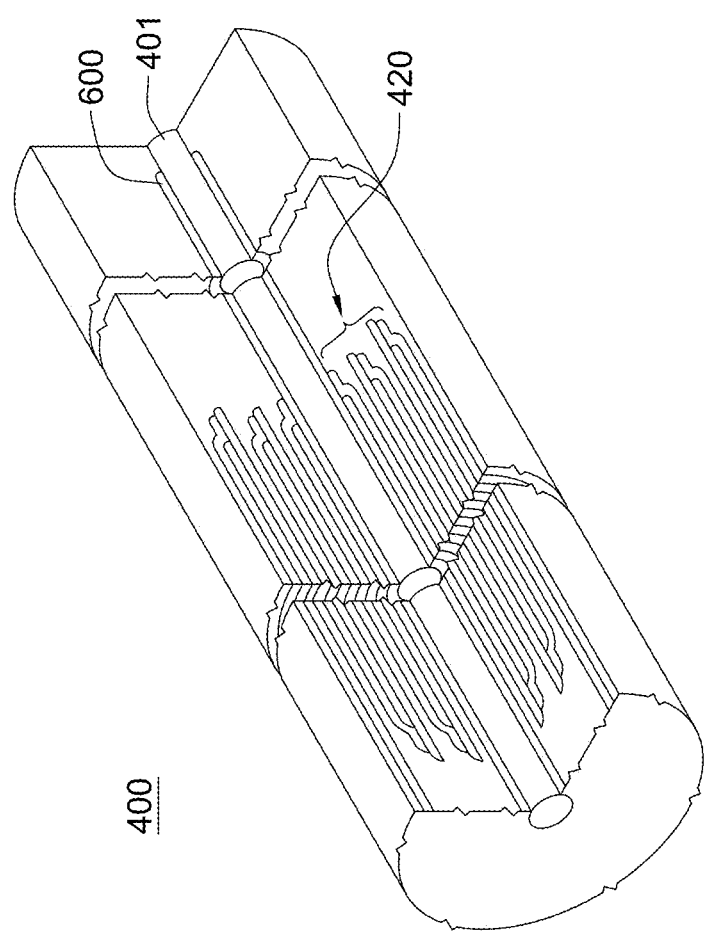
FIG. 8 is a partially cut-away view of one embodiment of a sensing device about a scaffold fiber of a fiber structure with embedded sensor, in accordance with one or more aspects of the present invention.

FIG. 8 is a partial cutaway depiction of a sensing device, such as thermopile 420 desired above in connection with FIGS. 4A-5, and which is configured to produce a bias voltage dependent on an applied thermal gradient in an axial direction of the fiber structure. In one embodiment, a base unit of thermopile 420 is a thermocouple that includes a pair of metal materials that meet at a junction. In the annular design of thermopile 420, the thermocouple pairs of materials are concentric microtubes formed around the fiber substrate, separated by an insulator layer. In one or more embodiments, the thermopile device is created by creating successive pairs in a stacked layer configuration, including a dielectric separator layer between the active thermocouple material layers, that are joined at either extremity of the cumulative stack. By way of example, two broad categories of thermocouple layer pair types are possible: bimetallic materials; and ceramic-based thermoelectrics. The metal-based pairs include combinations of tungsten-rhenium (W—Re), tungsten-molybdenum (W—Mo), tungsten-niobium (W—Nb), and molybdenum-niobium (Mo—Ni). The ceramic material options entail diboride and oxide compositions, such as hafnium diboride-tantalum diboride (HfB$_2$—TaB$_2$), and zinc oxide-indium oxide (ZnO—InO$_2$). For insulating separator layer(s), materials such as silicon carbide (SiC), silicon nitride (Si$_3$N$_4$), and boron nitride (BN), can be used. Focusing on the bimetallic thermopile material choices, a range of halogen-based gas precursors are available to deliver the desired elements, such as tungsten hexafluoride (WF$_6$), molybdenum hexafluoride (MoF$_6$), rhenium hexafluoride (ReF$_6$), and niobium pentafluoride (NbF$_5$). As noted, working with such fluorine-containing materials can require certain LCVD system specifications. An additional requirement is to properly capture unreacted gas effluent exhaust leaving the LCVD reactor chamber. This can be accomplished using an alumina media trap located upstream from the deposition system vacuum pump, and has been successfully deployed with other volatile halogen gasses, such as uranium hexafluoride (UF$_6$), and silicon tetrafluoride (SiF$_4$). The thermopile device can be fabricated in a variety of lengths, for instance, in a range of 0.25 to 2 centimeters, in one or more applications.

FIGS. 9A-9K depict further details of one embodiment of a process of fabricating a thermopile 420 within a fiber structure such as disclosed herein.

Figure 7E:
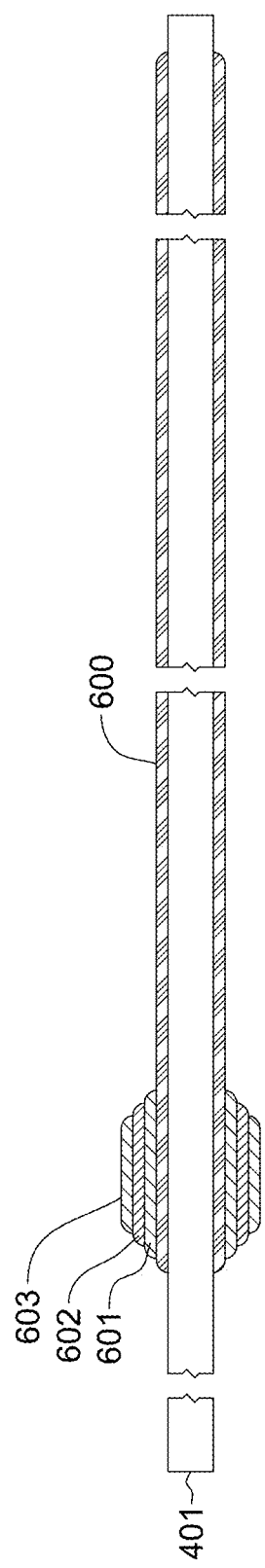

The intermediate structure of FIG. 9A illustrates the structure of FIG. 7E after deposition of an insulator layer 901 around the fiber, including, in part, over the radially-inner, cylindrical-shaped conductive element 600 that forms part of the dipole antenna. As illustrated in FIG. 9A, a portion of conductive element 600 remains uncovered by insulator layer 901.

In FIG. 9B, a cylindrical-shaped conductor 902 is deposited over, and in electrical contact with conductive element 600 of the dipole antenna. In one embodiment, conductive element 600 can be formed (for instance) of tungsten, and conductor 902 can be, for example, rhenium. Conductor 902 is formed, in one embodiment, as an annular conductive film over a portion of the radially-inner, cylindrical-shaped conductive element 600, and represents a first layer of thermopile 420. In FIG. 9C, an insulator 902, such as a silicon carbide insulator, has been deposited over the exposed portion of conductive element 600 and most of conductor 902, leaving an end of conductor 902 closest to solid state oscillator 410 exposed, as illustrated.

Figure 9D:
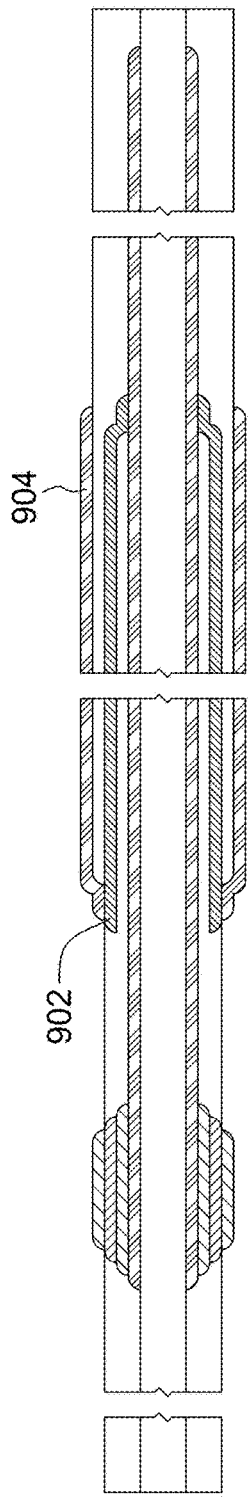

In FIG. 9D, another conductor 904 layer has been deposited over the intermediate thermopile stack in electrical contact with conductor 902, as illustrated. In one embodiment, conductor 904 is an annular conductive film substantially aligned with conductor 902 to facilitate forming the stacked annular layers of the thermopile. Where conductor 904 electrically contacts conductor 902, a thermocouple junction is defined. In one embodiment, conductor 904 can be formed of tungsten. This process of forming conductors of the thermopile of alternate materials repeats for the desired number of thermocouples of the thermopile.

Figure 9E:
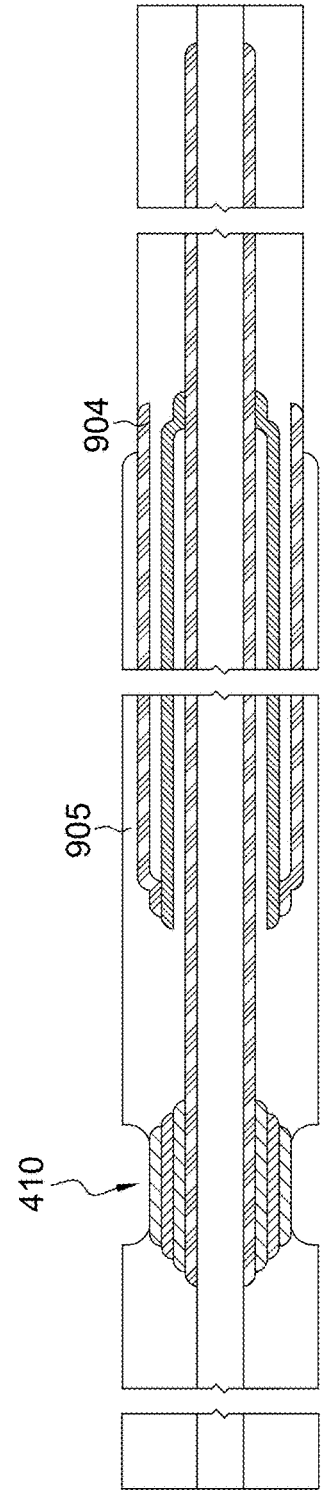
Figure 9F:
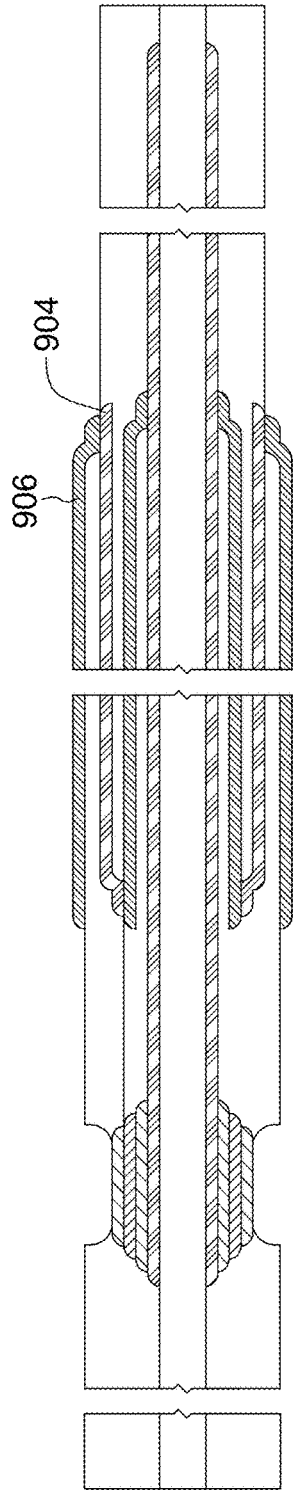

In FIG. 9E, an insulator layer 905 has been applied over conductor 904, leaving an end of conductor 904 farther from solid state oscillator 410 exposed. In FIG. 9F, a further conductor 906, e.g., formed of rhenium, of the thermopile has been deposited in electrical contact with conductor 904 where exposed.

In FIG. 9G, another insulator layer 907 has been deposited, such as a silicon carbide insulator layer, to substantially cover conductor 906, except for an end of the conductor closer to the oscillator. The process repeats in FIG. 9H, with conductor 908, for instance, formed of tungsten, having been deposited in electrical contact with the exposed end of conductor 906. In this manner, layers of spaced apart, alternating conductors are provided in an annular stack around the scaffold fiber to define thermopile 420.

Figure 9K:
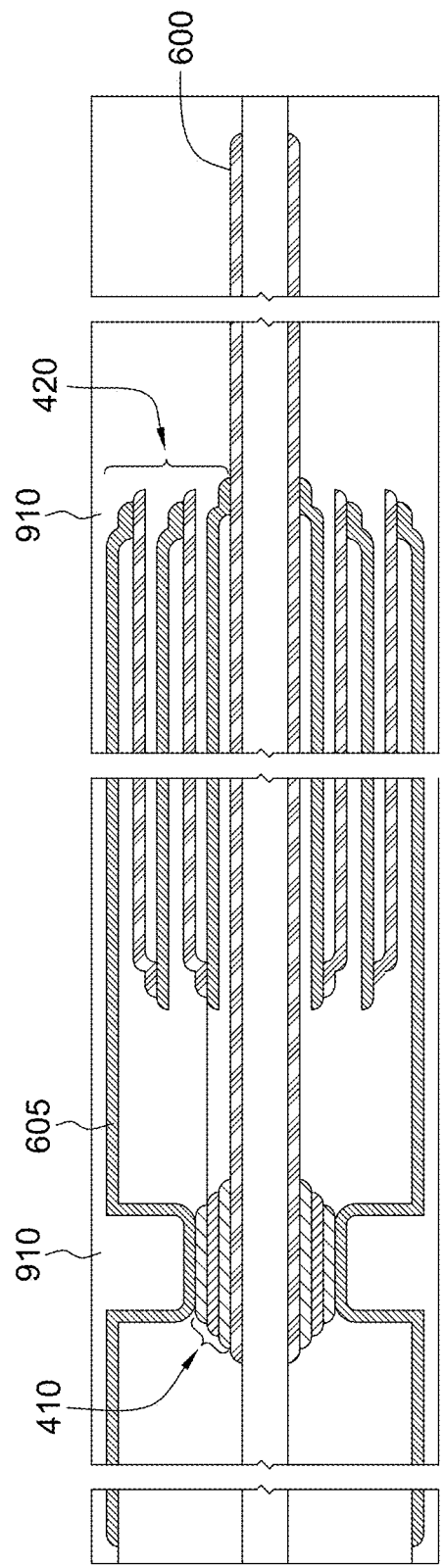

In FIG. 9I, an insulator layer 909 has been deposited over conductor 908, with an end thereof farther from oscillator 410 remaining exposed to allow contact to the thermopile, and in FIG. 9J, a radially-outer, cylindrical-shaped conductive element 605 of the dipole antenna has been deposited in electrical contact with the exposed portion of conductor 908 to electrically contact thermopile 420. As illustrated, in one embodiment, conductive element 605 is also in electrical contact with the second terminal of solid state oscillator 420, and further extends axially along the fiber structure to define the other conductive element of the dipole antenna. In FIG. 9K, a further insulator 910 has been deposited around the sensor to insulate and embed the sensor within the fiber structure.

Those skilled in the art will note that the thermopile embodiment illustrated in FIGS. 8-9K represents one embodiment only of a sensing device that can be an embedded sensor, such as described herein. For instance, in one or more other embodiments, a different thermal sensor, such as a piezoelectric sensor, or different thermoelectric sensor, can be fabricated about the scaffold fiber. Other types of sensors can also be used.

Those skilled in the art will note that the connection points in the thermopile, at the scaffold interface (inner radius) and outer circumference of the sensor structure (outer radius) register temperature gradients along the axial and radial direction. Taking a thermopile length of approximately 12 millimeters as an example, and a radial separation of the two thermopile junction points of about 2.5 microns, this equates to a ratio of 12000/2.5 (12 millimeters=120000 microns), or 4800 microns. Thus, the signal from the radial temperature difference over 2.5 microns will contribute a negligible signal compared to the axial temperature variation, which will drive the overall electric voltage generated by the thermopile.

As noted, in one or more aspects, 1½-D printing using LCVD processing is used herein, in one or more embodiments, and includes the following defining characteristics: a material-agnostic ability to grow filaments; an ability to vary diameter along the length of the filament; a material-agnostic ability to vary composition along the length of the filament; and a material-agnostic ability to coat specific sections of filaments with a desired material, morphology and/or thickness.

Figure 10:
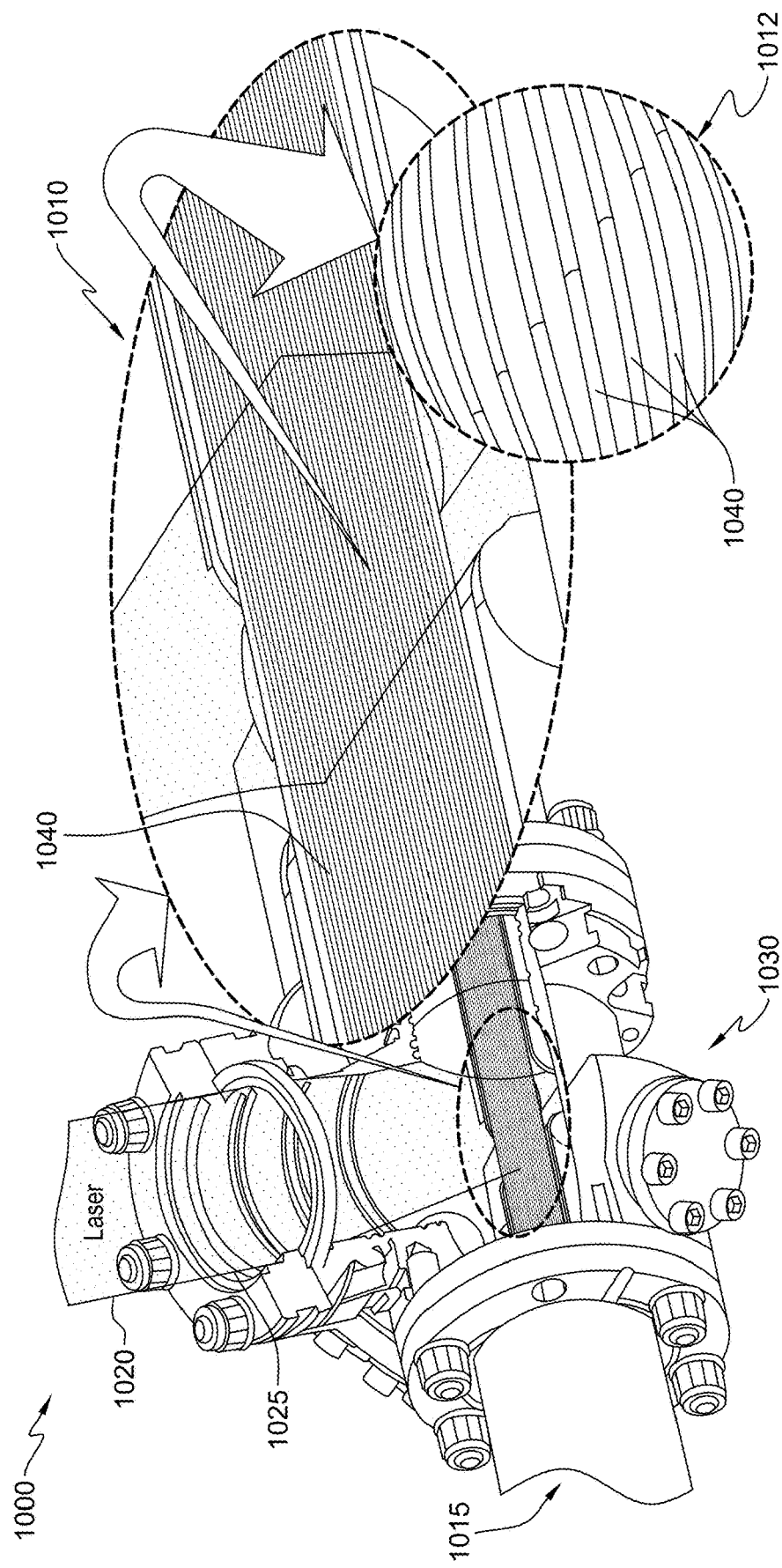
FIG. 10 depicts one embodiment of an apparatus for facilitating parallel fabrication of fiber structures with embedded sensors, in accordance with one or more aspects of the present invention.

Embodiments of the processes described herein can be applied to fabrication of one fiber structure with an embedded sensor or multiple fiber structures with one or more embedded sensors in parallel, such as multiple fiber structures arrayed together in a ribbon or tow-like structure, so that each layer of a component for one fiber structure is also formed about or around the other fiber structures as well, an example of which is shown in FIG. 10.

FIG. 10 depicts one example of a deposition tool 1000 that can be used to form a component layer of a fiber, or respective layers of respective layers of a plurality of fiber structures such as disclosed herein. Deposition tool 1000 can be, for example, a laser induced chemical vapor deposition (LCVD) tool, and can convey multiple fibers 1040, such as fiber structures discussed herein, through a conveyer inlet 1015 into a deposition chamber 1030. In operation, the deposition chamber can contain one or more precursor gases that facilitate forming a desired component layer of the process. A laser 1020 is provided, in one embodiment, through a focusing lens or window 1025, to be incident on multiple fibers 1040 concurrently as the multiple fibers 1040 are conveyed through the deposition chamber. As the laser 1020 interacts with multiple fibers 1040 and the precursor gases, the desired component layer of the fiber structure is deposited around the multiple fibers 1040 simultaneously. In one example, the laser is started and stopped at defined intervals as the multiple fibers pass through the deposition tool 1000, thus controlling formation of component layers around respective portions of the multiple fibers 1040 and leaving other portions unprocessed (as desired for a particular layer). The processed multiple fibers 1040 can be conveyed out of deposition tool 1000, for instance, to another deposition tool, in which another layer of the discrete component layers is to be formed, or can be finished and conveyed out of the tool entirely. The resulting fiber structure with embedded sensor can then be further arranged or disposed in a composite structure, if desired. For clarity, FIG. 10 includes close-up views 1010 and 1012 of the multiple fibers 1040 as the multiple fibers undergo LCVD processing to deposit one or more component layers on the fiber structures.

Figure 11:
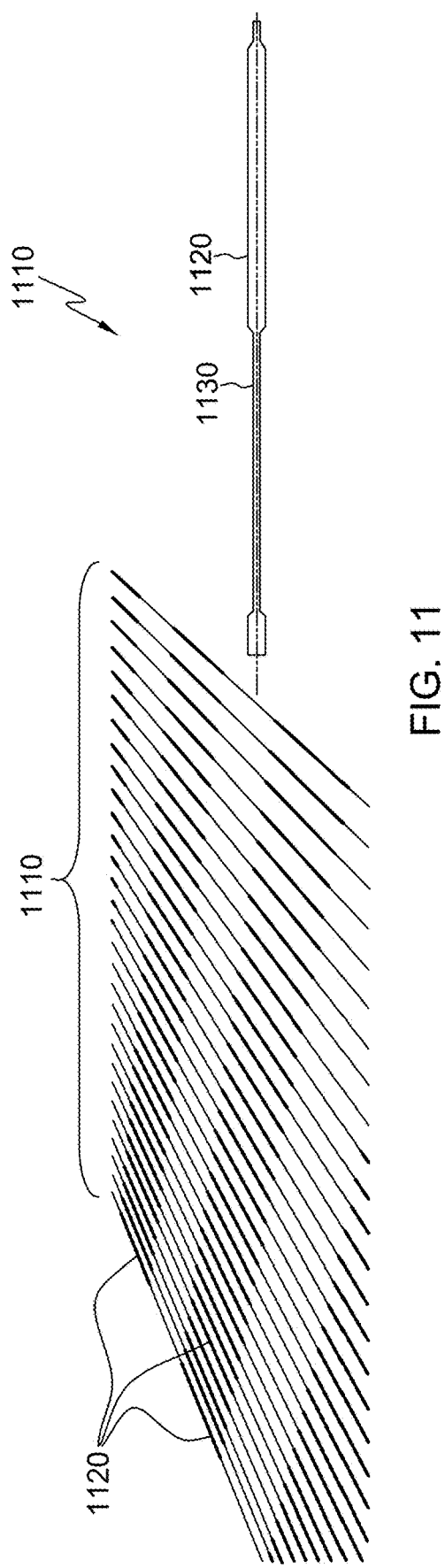
FIG. 11 illustrates one embodiment of a plurality of fiber structures, each with a plurality of discrete embedded sensors, in accordance with one or more aspects of the present invention.

As an enhancement, in one or more implementations, the processes disclosed herein can be used to create fiber structures with multiple embedded sensors along the length of the fibers. An example of this is depicted in FIG. 11, where fibers 1110 are shown to include embedded sensors 1120 and regions without embedded sensors 1130. In one or more implementations, the regions of discrete embedded sensors 1120 formed along the lengths of the fiber structures can include the same sensor devices, or different sensor devices, if desired for a particular application.

Figure 12:
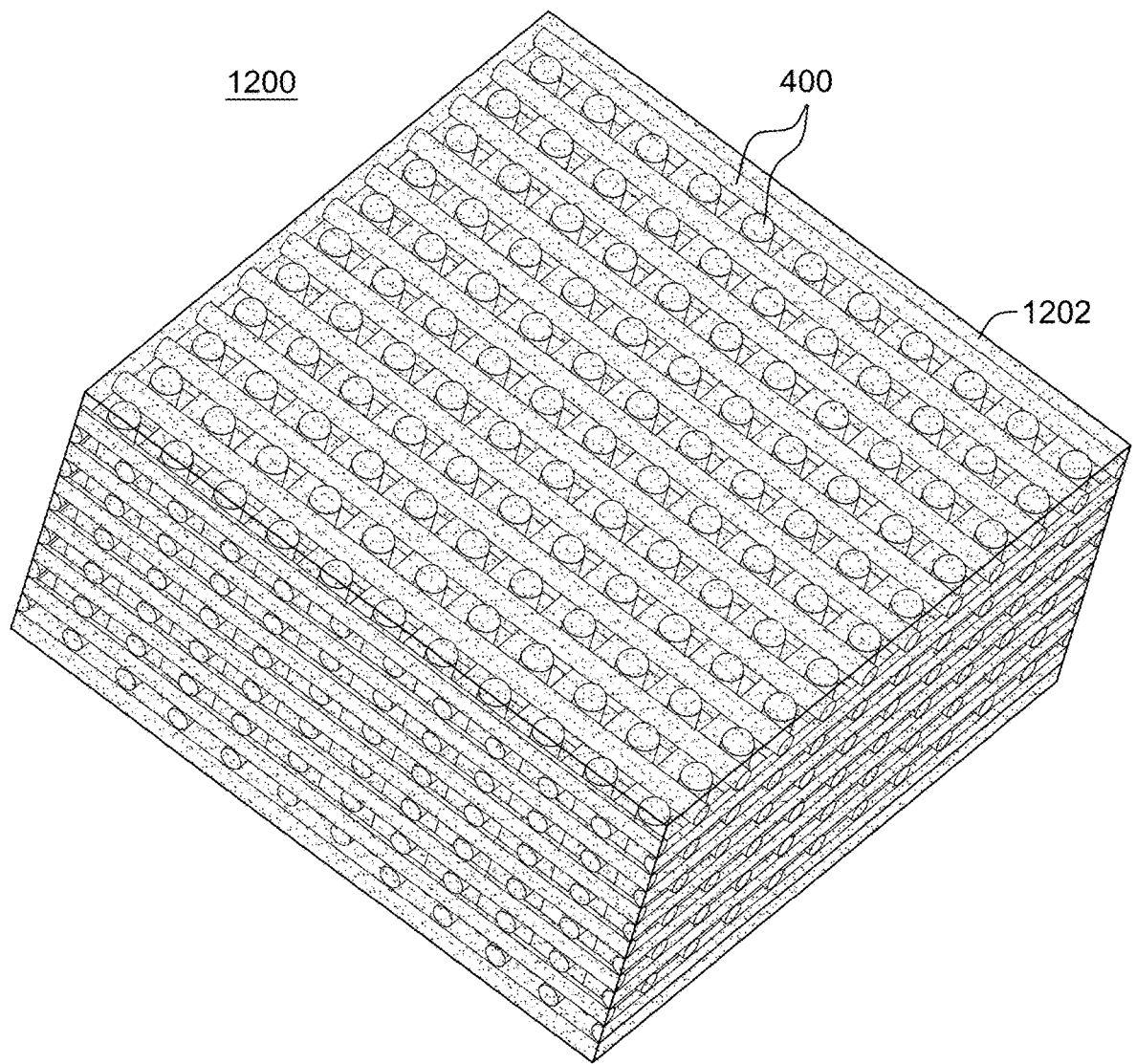
FIG. 12 depicts one embodiment of a composite structure with a plurality of fiber structures with embedded sensors incorporated into a matrix material, in accordance with one or more aspects of the present invention.

By way of further enhancement, FIG. 12 illustrates one embodiment of a composite structure 1200 formed of a plurality of fiber structures with embedded sensors 400 embedded within a composite or matrix material 1202. By way of example, fiber structures are shown in FIG. 12 oriented in all three dimensions. In one or more other embodiments, the fiber structures with embedded sensors could be disposed in one or two dimensions only, or could be randomly dispersed throughout the composite structure. In one or more embodiments, the matrix material used allows for wireless propagation of emitted signals from the embedded sensors through the composite structure. Although illustrated as a cube or square lattice of fiber structures, the composite structure can have any shape desired.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprise" (and any form of comprise, such as "comprises" and "comprising"), "have" (and any form of have, such as "has" and "having"), "include" (and any form of include, such as "includes" and "including"), and "contain" (and any form contain, such as "contains" and "containing") are open-ended linking verbs. As a result, a method or device that "comprises", "has", "includes" or "contains" one or more steps or elements possesses those one or more steps or elements, but is not limited to possessing only those one or more steps or elements. Likewise, a step of a method or an element of a device that "comprises", "has", "includes" or "contains" one or more features possesses those one or more features, but is not limited to possessing only those one or more features. Furthermore, a device or structure that is configured in a certain way is configured in at least that way, but may also be configured in ways that are not listed.

The corresponding structures, materials, acts, and equivalents of all means or step plus function elements in the claims below, if any, are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of one or more aspects of the invention and the practical application, and to enable others of ordinary skill in the art to understand one or more aspects of the invention for various embodiments with various modifications as are suited to the particular use contemplated.

What is claimed is:

1. A method of producing a composite structure, the method comprising:
  forming a plurality of fiber structures with embedded sensors, each fiber structure with embedded sensor of the plurality of fiber structures with embedded sensors comprising:
    a scaffold fiber;
    a solid state oscillator about the scaffold fiber;
    a sensing device about the scaffold fiber electrically coupled to the solid state oscillator to effect, at least in part, oscillations of the solid state oscillator; and
    an antenna about the scaffold fiber electrically connected to the solid state oscillator to facilitate in operation wireless transmitting of a signal from the fiber structure with embedded sensor; and
  embedding the plurality of fiber structures with embedded sensors within a material to fabricate the composite structure, wherein in operation the plurality of fiber structures with embedded sensors provide respective wireless signal outputs through the material.

2. The method of claim 1, wherein the solid state oscillator comprises an annular solid state oscillator around the scaffold fiber.

3. The method of claim 2, wherein the annular solid state oscillator is an annular Gunn-diode oscillator around the scaffold fiber.

4. The method of claim 1, wherein the sensing device is an annular thermopile around the scaffold fiber, the annular thermopile generating a DC voltage based on a sensed temperature gradient, and wherein the annular thermopile comprises multiple series-connected annular thermocouples arranged in an annular stack around the scaffold fiber.

5. The method of claim 1, wherein the antenna comprises a dipole antenna, the dipole antenna comprising a radially-inner, cylindrical-shaped conductive element extending axially along the scaffold fiber, and a radially-outer, cylindrical-shaped conductive element extending axially along the scaffold fiber.

6. The method of claim 1, wherein antenna is a dipole antenna with a length axially along the scaffold fiber defined relative to a specified peak frequency signal of the fiber structure with embedded sensor.

7. The method of claim 1, wherein the embedded sensors of the fiber structures with embedded sensors each comprise a wireless, annular heat-flux sensor configured to sense a temperature differential axially along at least a portion of the fiber structure with embedded sensor, the wireless, annular heat-flux sensor comprising the solid state oscillator, the sensing device and the antenna.

* * * * *